US 7,949,910 B2

(12) United States Patent
Kanno et al.

(10) Patent No.: US 7,949,910 B2
(45) Date of Patent: *May 24, 2011

(54) MEMORY SYSTEM AND CONTROL METHOD THEREOF

(75) Inventors: Shinichi Kanno, Tokyo (JP); Hirokuni Yano, Tokyo (JP); Toshikatsu Hida, Kawasaki (JP); Kazuya Kitsunai, Kawasaki (JP); Junji Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/705,431

(22) Filed: Feb. 12, 2010

(65) Prior Publication Data

US 2010/0146228 A1 Jun. 10, 2010

Related U.S. Application Data

(63) Continuation of application No. 12/551,213, filed on Aug. 31, 2009, which is a continuation of application No. PCT/JP2008/066507, filed on Sep. 8, 2008.

(30) Foreign Application Priority Data

Apr. 24, 2008 (JP) .................................. 2008-114230

(51) Int. Cl.
*G11C 29/00* (2006.01)
*G06F 13/00* (2006.01)
*G06F 13/28* (2006.01)
(52) U.S. Cl. ......... 714/718; 714/723; 365/201; 711/103
(58) Field of Classification Search .................. None
See application file for complete search history.

(56) References Cited

U.S. PATENT DOCUMENTS

| 4,924,251 | A | * | 5/1990 | Ishimura et al. ............. 396/62 |
| 5,172,338 | A | | 12/1992 | Mehrotra et al. |
| 5,379,262 | A | | 1/1995 | Okamoto et al. |
| 5,485,595 | A | | 1/1996 | Assar et al. |
| 6,081,447 | A | | 6/2000 | Lofgren et al. |
| 6,421,279 | B1 | | 7/2002 | Tobita et al. |

(Continued)

FOREIGN PATENT DOCUMENTS

| JP | 2-292798 | 12/1990 |
| JP | 6-250798 | 9/1994 |
| JP | 7-56780 | 3/1995 |

(Continued)

OTHER PUBLICATIONS

U.S. Appl. No. 12/542,222, filed Aug. 17, 2009, Yano, et al.

(Continued)

*Primary Examiner* — Robert Beausoliel
*Assistant Examiner* — Guerrier Merant
(74) *Attorney, Agent, or Firm* — Oblon, Spivak, McClelland, Maier & Neustadt, L.L.P.

(57) ABSTRACT

A memory system includes a nonvolatile memory including blocks as data erase units, a measuring unit which measures an erase time at which data in each block is erased, a block controller having a block table which associates a state value indicating one of a free state and a used state with the erase time for each block, a detector which detects blocks in which rewrite has collectively occurred within a short period, a first selector which selects a free block having an old erase time as a first block, a second selector which selects a block in use having an old erase time as a second block, and a leveling unit which moves data in the second block to the first block if the first block is included in the blocks detected by the detector.

22 Claims, 29 Drawing Sheets

U.S. PATENT DOCUMENTS

| | | |
|---|---|---|
| 7,283,397 B2 | 10/2007 | Harari et al. |
| 7,496,811 B2 | 2/2009 | Kanno |
| 7,551,478 B2 | 6/2009 | Kanno |
| 7,590,919 B2 | 9/2009 | Kanno |
| 2002/0003252 A1 | 1/2002 | Iyer |
| 2004/0083335 A1 | 4/2004 | Gonzalez et al. |
| 2007/0075686 A1 | 4/2007 | Togashi et al. |
| 2008/0205145 A1 | 8/2008 | Kanno et al. |
| 2009/0132891 A1 | 5/2009 | Kanno |
| 2009/0177944 A1 | 7/2009 | Kanno |
| 2009/0183052 A1 | 7/2009 | Kanno et al. |
| 2010/0011260 A1 | 1/2010 | Nagadomi et al. |

FOREIGN PATENT DOCUMENTS

| | | |
|---|---|---|
| JP | 8-16482 | 1/1996 |
| JP | 11-96779 | 4/1999 |
| JP | 2000-20252 | 1/2000 |
| JP | 2002-24077 | 1/2002 |
| JP | 2002-133887 | 5/2002 |
| JP | 2003-308242 | 10/2003 |

OTHER PUBLICATIONS

U.S. Appl. No. 12/529,126, filed Aug. 28, 2009, Yano, et al.
U.S. Appl. No. 12/529,139, filed Aug. 28, 2009, Yano, et al.
U.S. Appl. No. 12/529,193, filed Aug. 31, 2009, Yano, et al.
U.S. Appl. No. 12/529,127, filed Aug. 28, 2009, Yano, et al.
U.S. Appl. No. 12/529,270, filed Aug. 31, 2009, Yano, et al.
U.S. Appl. No. 12/529,192, filed Aug. 31, 2009, Yano, et al.
U.S. Appl. No. 12/529,228, filed Aug. 31, 2009, Yano, et al.
U.S. Appl. No. 12/552,442, filed Sep. 2, 2009, Yano, et al.
U.S. Appl. No. 12/552,403, filed Sep. 2, 2009, Yano, et al.
U.S. Appl. No. 12/552,330, filed Sep. 2, 2009, Yano, et al.
U.S. Appl. No. 12/552,461, filed Sep. 2, 2009, Yano, et al.
U.S. Appl. No. 12/555,274, filed Sep. 8, 2009, Kanno, et al.
U.S. Appl. No. 12/563,856, filed Sep. 21, 2009, Yano, et al.
U.S. Appl. No. 12/566,236, filed Sep. 24, 2009, Yano, et al.
David A. Patterson and John L. Hennessy, "Computer Organization and Design: The Hardware/Software Interface", Morgan Kaufman Pub, 2004, p. 540-544.
Neal Mielke et al., "Flash EEPROM Threshold Instabilities due to Charge Trapping During Progam/Erase Cycling", IEEE Transactions on Device and Materials Reliability, vol. 4 No. 3, Sep. 2004, pp. 335-344.
Neal Mielke et al., "Recovery Effects in the Distributed Cycling of Flash Memories", $44^{th}$ Annual International Reliabiliity Physics Symposium, 2006, pp. 29-35.
European Search Report mailed Mar. 3, 2011 in PCT/JP2008066507.

* cited by examiner

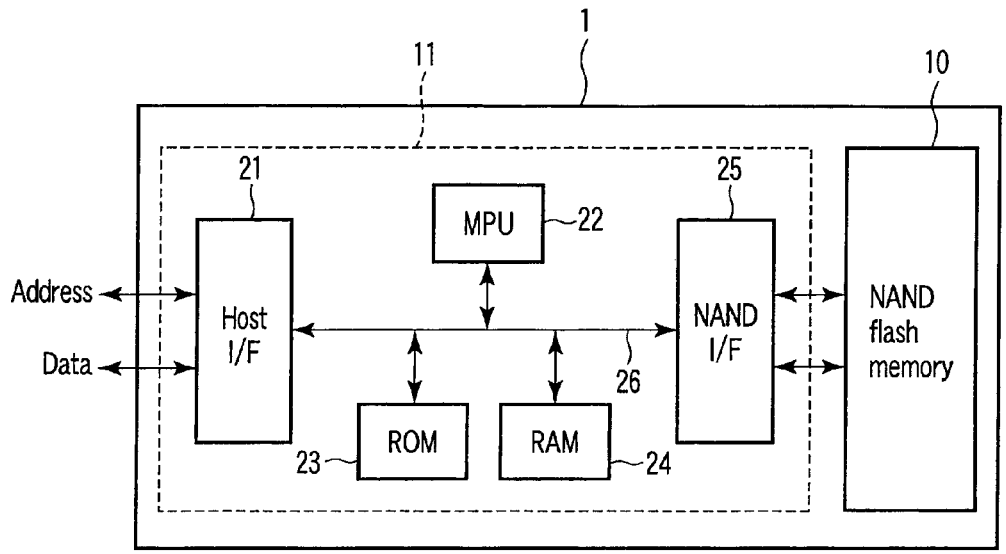
F I G. 2
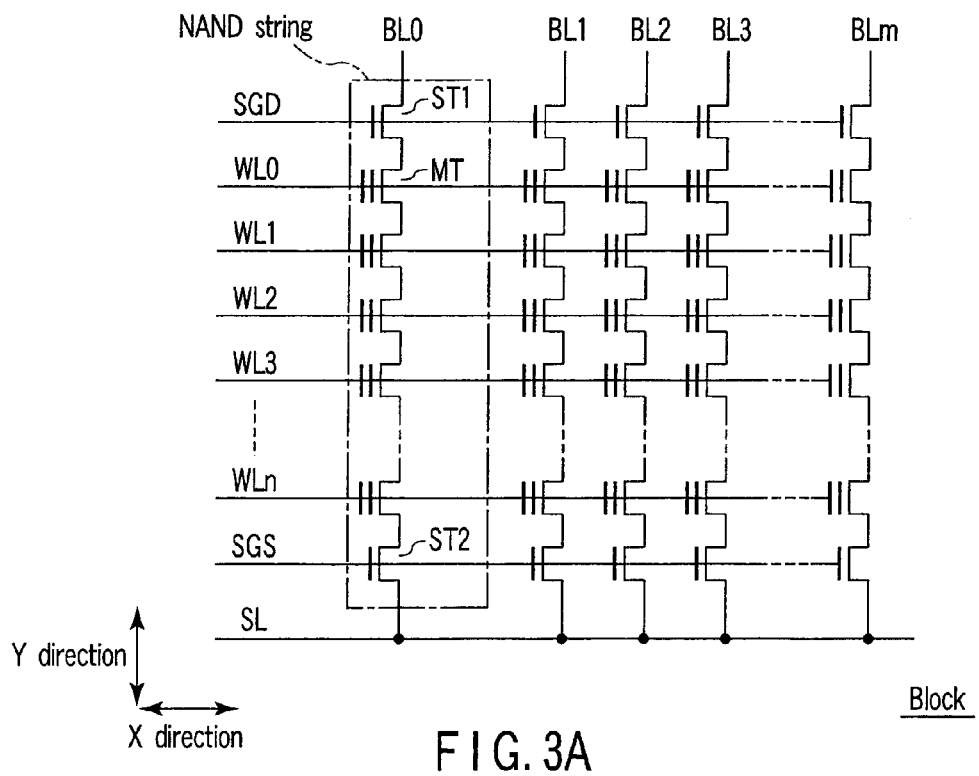
F I G. 3A

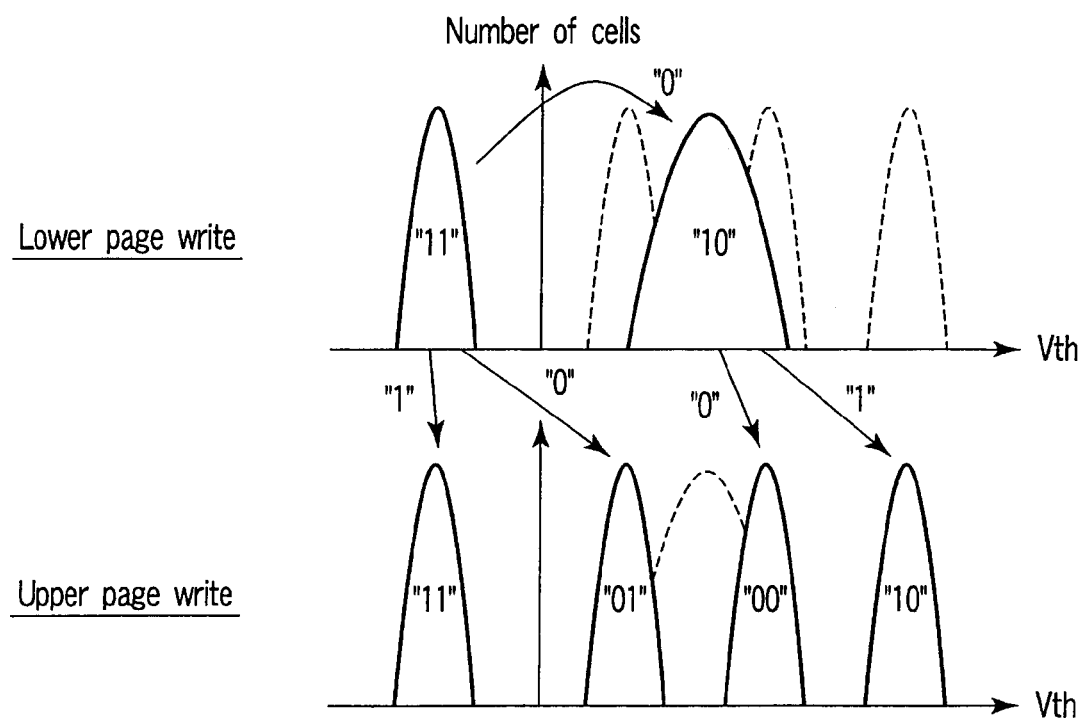
F I G. 3B

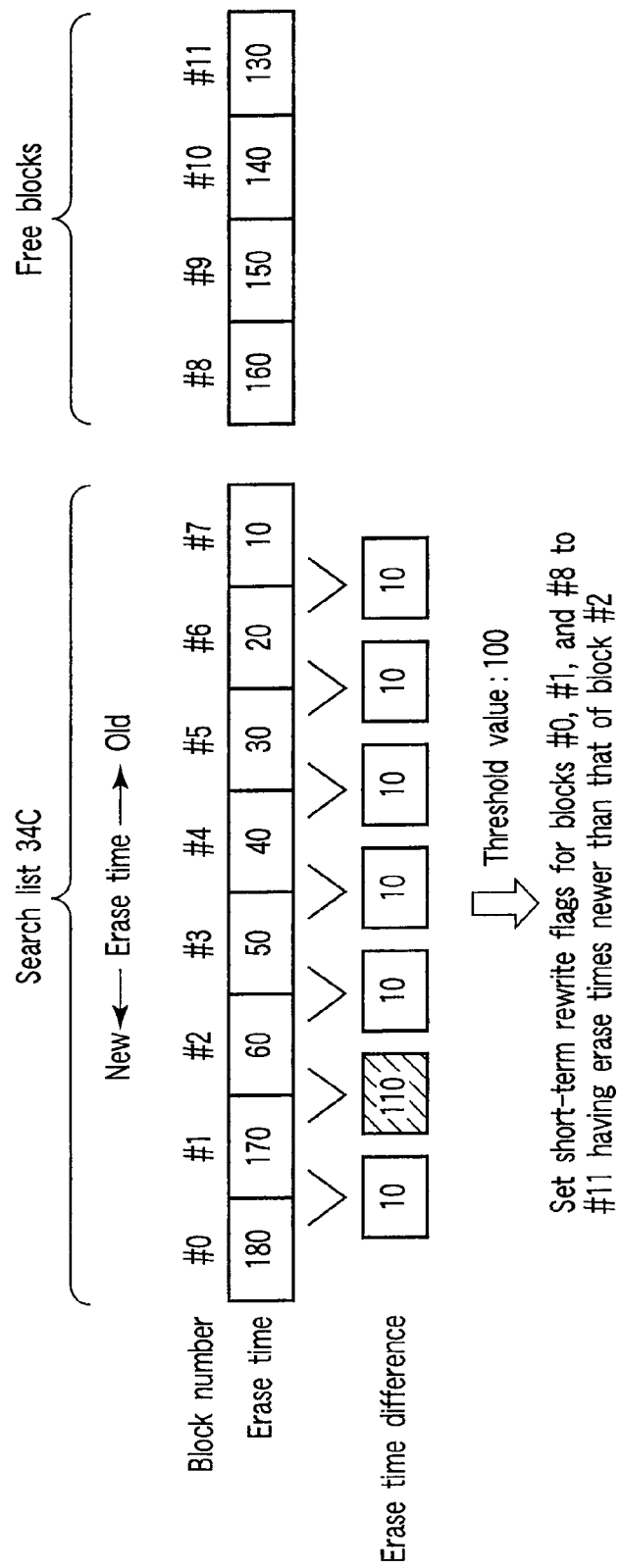
F I G. 14

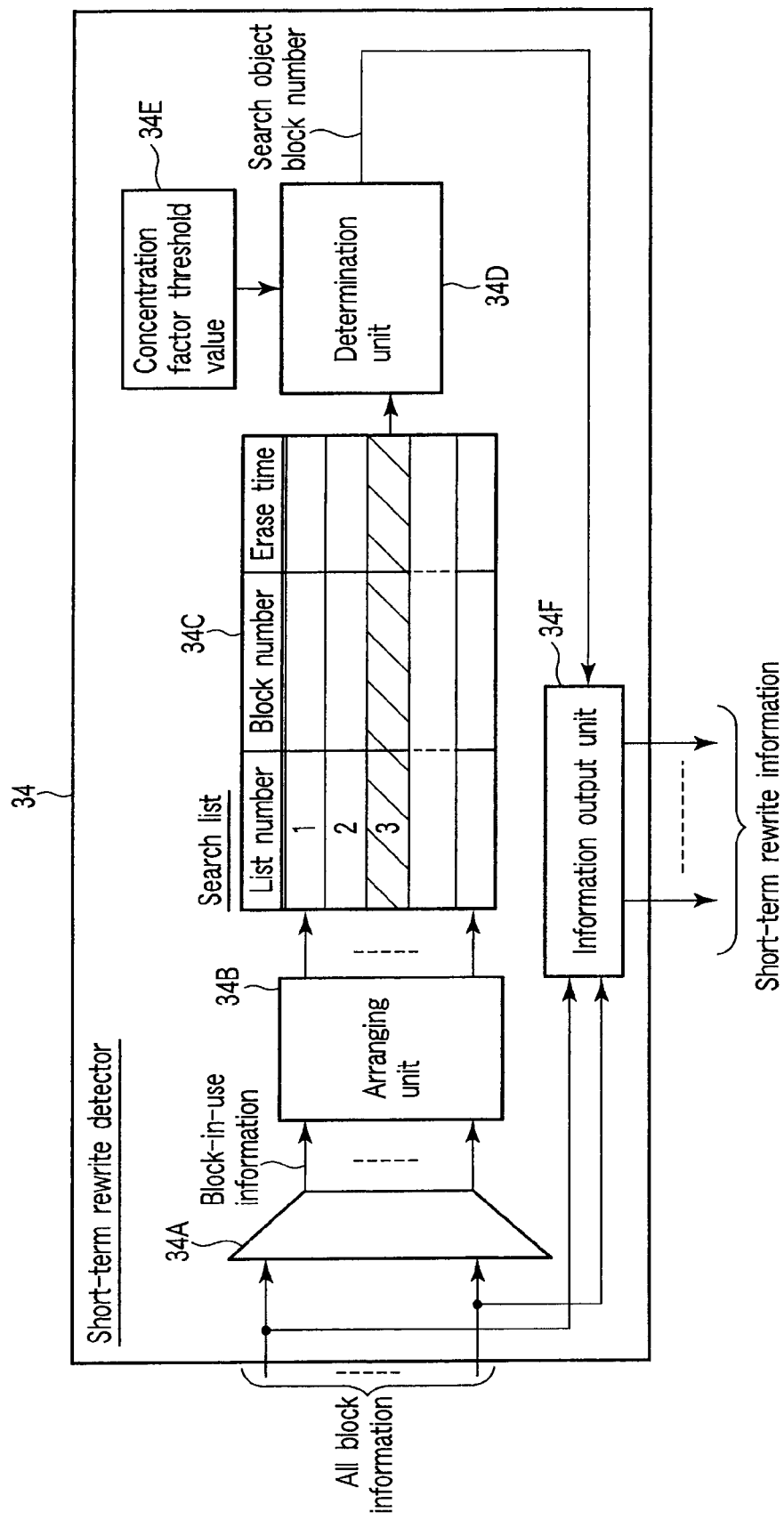
F I G. 23

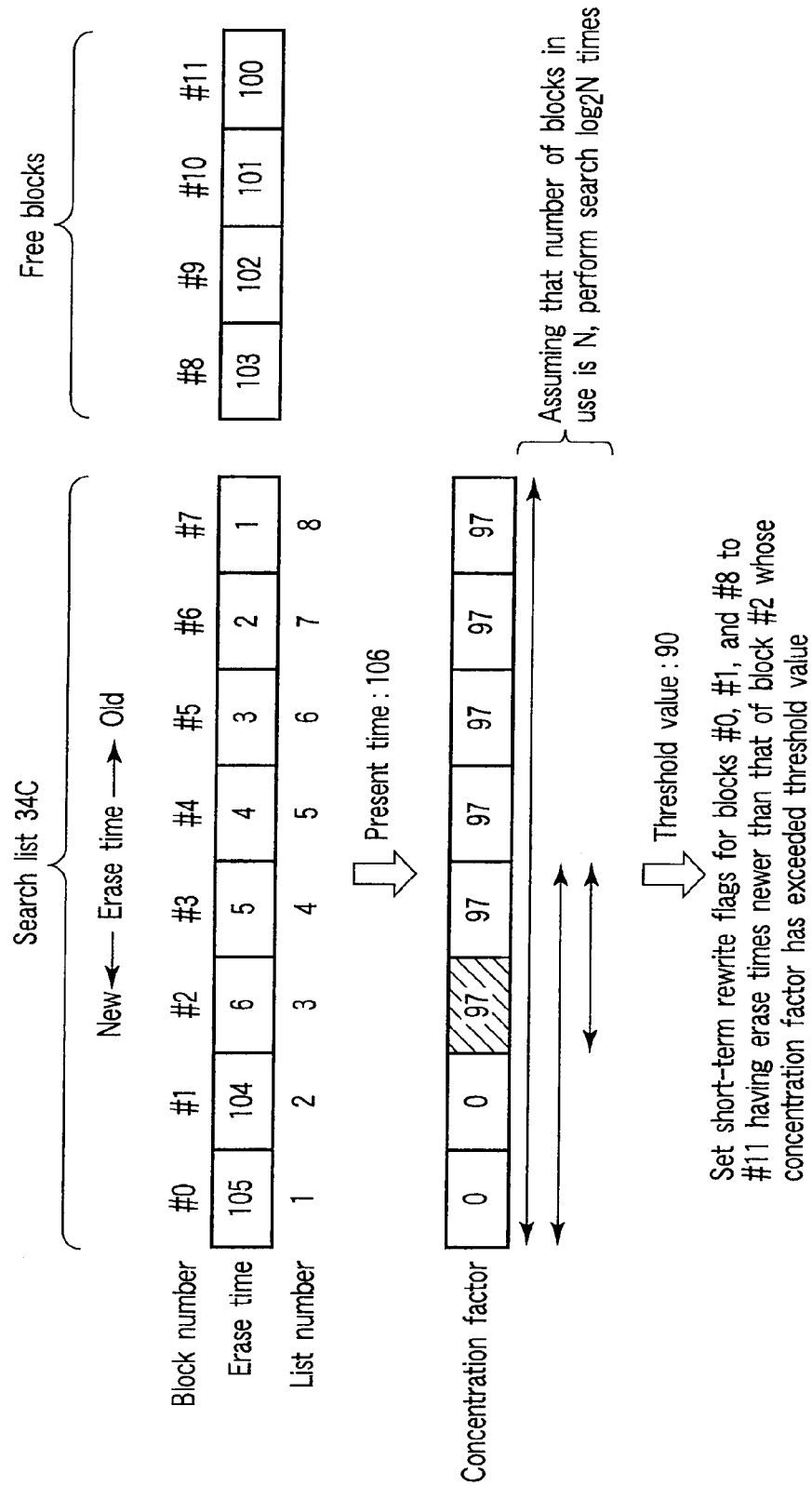
F I G. 26

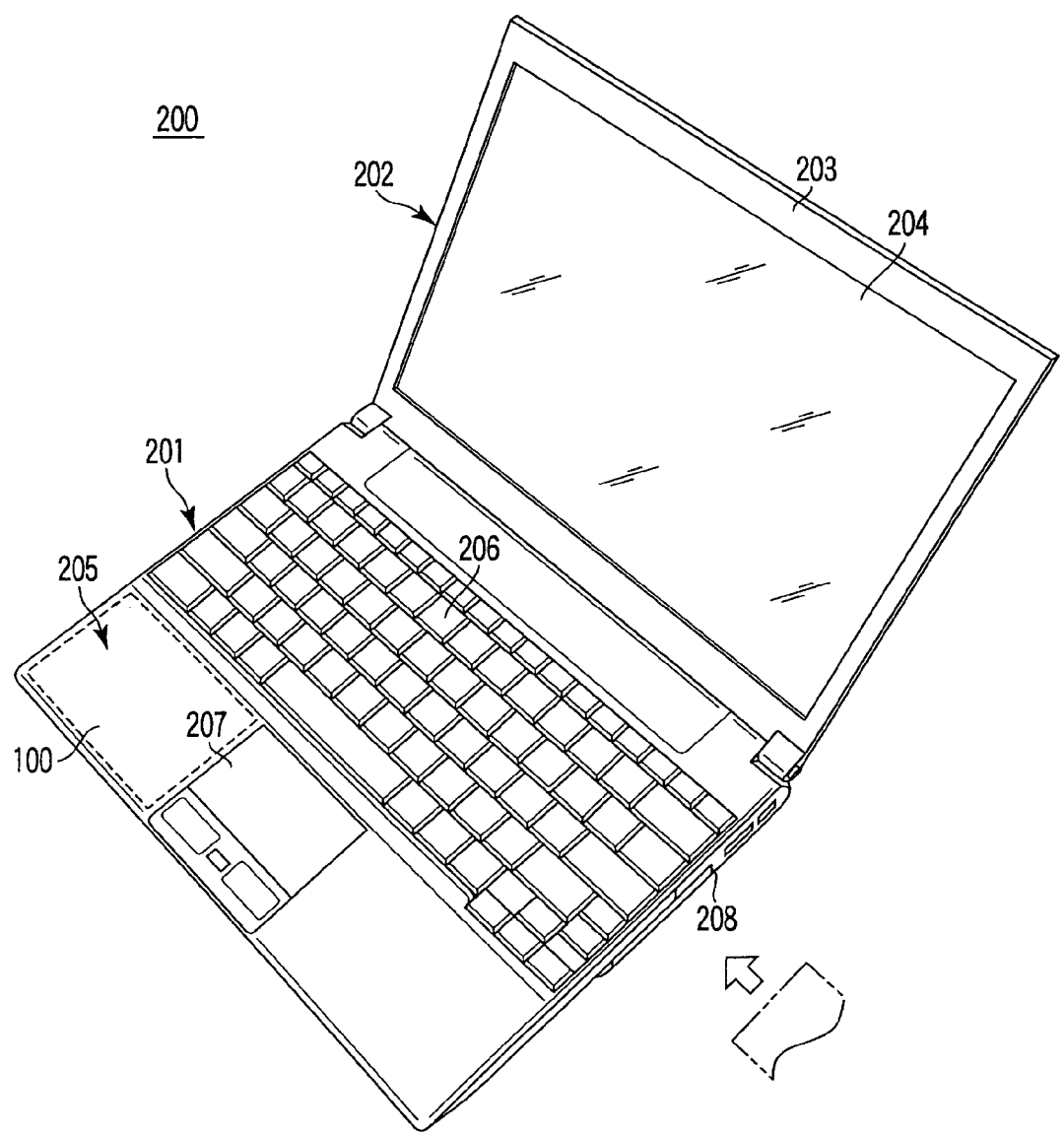
F I G. 34

MEMORY SYSTEM AND CONTROL METHOD THEREOF

CROSS-REFERENCE TO RELATED APPLICATIONS

This is a continuation of and claims the benefit of priority under 35 U.S.C. §120 from U.S. application Ser. No. 12/551,213, filed Aug. 31, 2009, which is a Continuation Application of PCT Application No. PCT/JP2008/066507, filed Sep. 8, 2008, which was published under PCT Article 21(2) in English. PCT/JP2008/066507 is based upon and claims the benefit of priority from prior Japanese Patent Application No. 2008-114230, filed Apr. 24, 2008. The entire contents of each of the above are incorporated herein by reference.

BACKGROUND OF THE INVENTION

1. Field of the Invention

This invention relates to a memory system and a control method thereof, and, for example, a memory system having a NAND flash memory.

2. Description of the Related Art

Recently, nonvolatile semiconductor memories are used in various portions such as large-scale computers, personal computers, home electrical appliances, portable telephones and the like. Particularly, NAND flash memories are nonvolatile semiconductor memories that are electrically rewritable and can be formed with large capacity and high integration density. Further, recently, it is considered to use the NAND flash memory instead of a hard disc drive (HDD).

The NAND flash memory is a semiconductor memory that requires an erase process before a write process is performed. The service life thereof depends on the number of rewrite operations. The data write/erase operation in the NAND flash memory is to inject/discharge electrons with respect to the floating gate by applying high voltage between the substrate and the control gate. If the above operation is performed by a large number of times, the gate oxide film lying around the floating gate is degraded and electrons injected into the floating gate are extracted to destroy data. That is, when the number of rewrite operations is increased, a period in which data is kept retained after data was written becomes short (the retention characteristic is degraded).

Further, data recorded by use of personal computers and the like has both of time locality and regional locality (Document 1: David A. Patterson and John L. Hennessy, "Computer Organization and Design: The hardware/Software Interface", Morgan Kaufmann Pub, Aug. 31, 2004). Therefore, if data items are sequentially recorded as they are in addresses specified from the exterior when data is recorded, the rewrite processes, that is, erase processes are concentrated in a specified region in a short period and thus the number of erase processes becomes largely unbalanced.

It is known that the service life of the NAND flash memory also depends on the interval between the erase processes and the retention characteristic becomes better and the service life becomes longer as the interval becomes longer (Document 2: Neal Mielke et al., "Flash EEPROM Threshold Instabilities due to Charge Trapping During Program/Erase Cycling", IEEE TRANSACTIONS ON DEVICE AND MATERIALS RELIABILITY, VOL. 4, NO. 3, SEPTEMBER 2004, PP. 335-344). This also indicates that the retention characteristic becomes degrading and the service life becomes shorter as the erase interval becomes shorter.

Further, it is known that the retention characteristic is recovered even when the write operations are performed at short intervals unless an erase process is performed for a corresponding long period (Document 3: Neal Mielke et al., "Recovery Effects in the Distributed Cycling of Flash Memories", 44th Annual International Reliability Physics Symposium, San Jose, 2006, PP. 29-35).

BRIEF SUMMARY OF THE INVENTION

According to an aspect of the present invention, there is provided a memory system comprising: a nonvolatile memory including a plurality of blocks as data erase units; a measuring unit which measures an erase time at which data in each block is erased; a block controller having a block table which associates a state value indicating one of a free state and a used state with the erase time for each block; a detector which detects blocks in which rewrite has collectively occurred within a short period; a first selector which selects a free block having an old erase time as a first block, on the basis of an information in the block table; a second selector which selects a block in use having an old erase time as a second block, on the basis of the information in the block table; and a leveling unit which moves data in the second block to the first block if the first block is included in the blocks detected by the detector.

According to an aspect of the present invention, there is provided a control method of a memory system including a nonvolatile memory having a plurality of blocks as data erase units, the method comprising: measuring an erase time at which data in each block is erased; generating a block table which associates a state value indicating one of a free state and a used state with the erase time for each block; detecting blocks in which rewrite has collectively occurred within a short period; selecting a free block having an old erase time as a first block, on the basis of an information in the block table; selecting a block in use having an old erase time as a second block, on the basis of the information in the block table; and moving data in the second block to the first block if the first block is included in the detected blocks.

BRIEF DESCRIPTION OF THE SEVERAL VIEWS OF THE DRAWING

FIG. 2 is a schematic view showing the configuration of the memory system 1 according to the first embodiment;

FIG. 3A is a circuit diagram showing the arrangement of a block included in a NAND flash memory 10;

FIG. 3B is a view showing an example of a threshold distribution obtained in a four-level data recording system;

FIG. 14 is a view for explaining a practical example of the short-term rewrite detecting process;

FIG. 23 is a block diagram showing the arrangement of a short-term rewrite detector 34 according to the fourth embodiment of the present invention;

FIG. 26 is a view for explaining a practical example of the short-term rewrite detecting process;

FIG. 34 is a perspective view showing one example of a portable computer 200 having an SSD 100 mounted thereon.

DETAILED DESCRIPTION OF THE INVENTION

Figure 1:
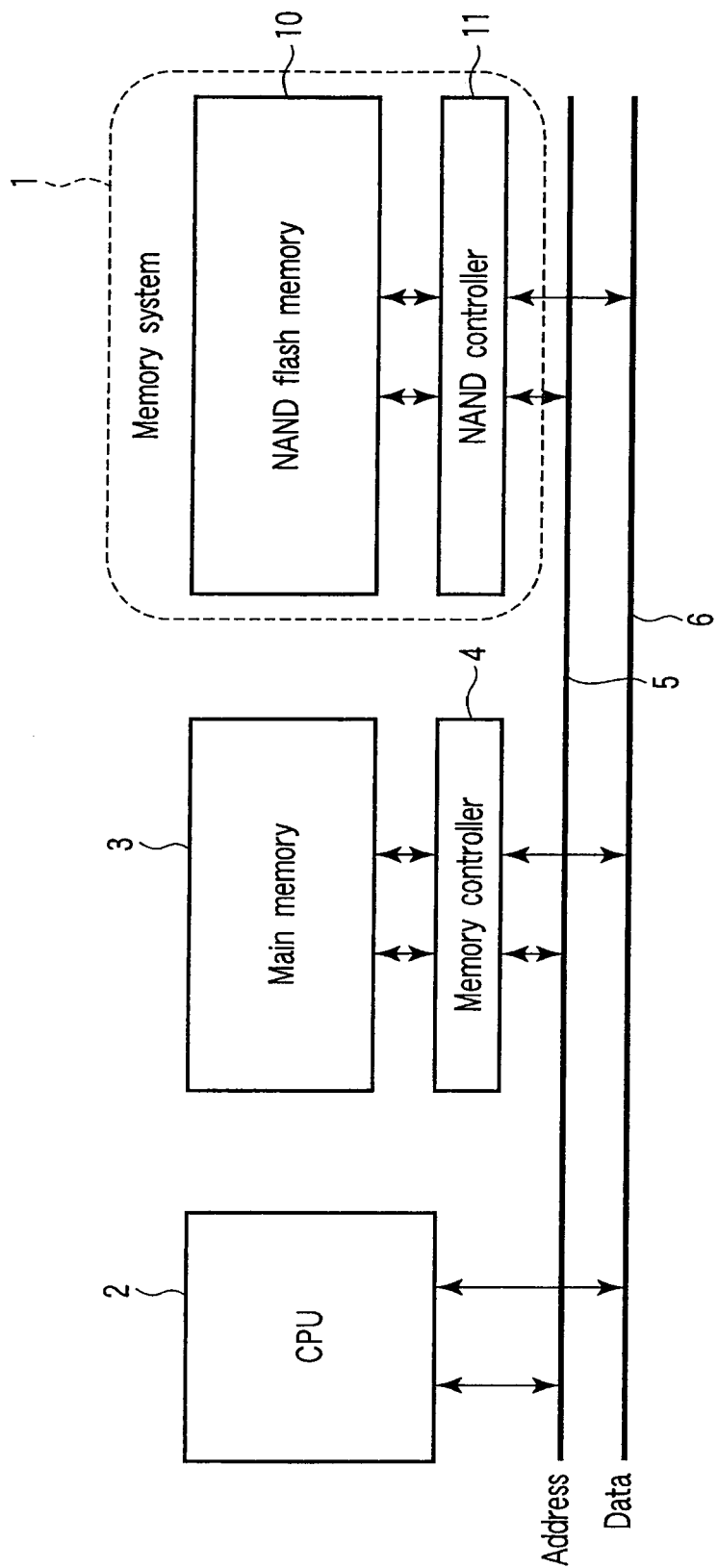
FIG. 1 is a schematic view showing an example of a computer system including a memory system 1 according to the first embodiment of the present invention.

Embodiments of the present invention will be explained below with reference to the accompanying drawing. Note that in the following explanation, the same reference numerals denote elements having the same functions and arrangements, and a repetitive explanation will be made only when necessary.

First Embodiment

A memory system of this embodiment is mounted on a printed circuit board having a host device mounted on it, and exchanges data with the host device via a bus. Alternatively, the memory system of this embodiment is designed to be detachably attached to a host device. This memory system is connected to the host device and exchanges data with the host device via a bus. FIG. 1 is a schematic view showing an example of a computer system including a memory system 1 of this embodiment.

The computer system comprises a central processing unit (CPU) 2, a main memory 3 such as a dynamic random access memory (DRAM), a memory controller 4 for controlling the main memory 3, and the memory system 1 of this embodiment. The CPU 2, main memory 3, and memory system 1 are connected to each other via an address bus 5 for handling addresses and a data bus 6 for handling data.

In this computer system, if a transfer request (read request or write request) from the CPU 2 is the write request, data (including externally input data) of the CPU 2 or data of the main memory 3 is transferred to the memory system 1. If the transfer request from the CPU 2 is the read request, data of the memory system 1 is transferred to the CPU 2 or main memory 3.

The memory system 1 comprises a NAND flash memory 10 as a kind of a nonvolatile semiconductor memory, and a NAND controller 11 for controlling the NAND flash memory 10. An example of the configuration of the memory system 1 will be explained below.

[1. Configuration of Memory System 1]

FIG. 2 is a schematic view showing the configuration of the memory system 1. The memory system 1 comprises the NAND flash memory 10 and NAND controller 11. The NAND controller 11 includes a host interface circuit (host I/F) 21, micro processing unit (MPU) 22, read only memory (ROM) 23, random access memory (RAM) 24, and NAND interface circuit (NAND I/F) 25.

The host interface circuit 21 performs interface processing between the NAND controller 11 and the host devices (CPU 2, main memory 3 and the like) in accordance with a predetermined protocol.

The MPU 22 controls the overall operation of the memory system 1. When the power supply of the memory system 1 is turned on, for example, the MPU 22 reads firmware (a control program) stored in the ROM 23 onto the RAM 24 and executes predetermined processing, thereby forming various tables on the RAM 24. The MPU 22 also receives a write request, read request, and erase request from the host devices, and executes predetermined processing on the NAND flash memory 10 in accordance with these requests.

The ROM 23 stores, e.g., the control program to be controlled by the MPU 22. The RAM 24 is used as a work area of the MPU 22, and stores the control program and various tables loaded from the ROM 23. The NAND interface circuit 25 performs interface processing between the NAND controller 11 and NAND flash memory 10 in accordance with a predetermined protocol.

The NAND flash memory 10 is formed by arranging a plurality of blocks as minimum units of data erase. FIG. 3A is a circuit diagram showing the arrangement of a block included in the NAND flash memory 10. Each block includes (m+1) NAND strings arranged in order along the X direction (m is an integer of 0 or more). A selection transistor ST1 included in each of the (m+1) NAND strings has a drain connected to a corresponding one of bit lines BL0 to BLm, and a gate connected to a common selection gate line SGD. A selection transistor ST2 included in each of the (m+1) NAND strings has a source connected to a common source line SL, and a gate connected to a common selection gate line SGS.

In each NAND string, (n+1) memory cell transistors MT are arranged between the source of the selection transistor ST1 and the drain of the selection transistor ST2 such that the current paths of the memory cell transistors MT are connected in series (n is an integer of 0 or more). That is, the (n+1) memory cell transistors MT are connected in series in the Y direction such that adjacent transistors share the diffusion region (source region or drain region).

Control gate electrodes are connected to word lines WL0 to WLn in order from the memory cell transistor MT positioned closest to the drain side. Accordingly, the drain of the memory cell transistor MT connected to the word line WL0 is connected to the source of the selection transistor ST1, and the source of the memory cell transistor MT connected to the word line WLn is connected to the drain of the selection transistor ST2.

The word lines WL0 to WLn connect the control gate electrodes of the memory cell transistors MT together between the NAND strings in the block. That is, the control gate electrodes of the memory cell transistors MT in the same row in the block are connected to the same word line WL. The (m+1) memory cell transistors MT connected to the same word line WL are handled as a page, and data write and read are performed page by page.

The bit lines BL0 to BLm connect the drains of the selection transistors ST1 together between the blocks. That is, the NAND strings in the same column in a plurality of blocks are connected to the same bit line BL.

Each memory cell transistor MT is a metal oxide semiconductor field effect transistor (MOSFET) having a stacked gate structure formed on a semiconductor substrate. The stacked gate structure is formed by sequentially stacking a gate insulating film, charge storage layer (floating gate electrode), inter-gate insulating film, and control gate electrode on the semiconductor substrate. The memory cell transistor MT changes its threshold voltage in accordance with the number of electrons stored in the floating gate electrode, and stores data in accordance with the difference between the threshold voltages. The memory cell transistor MT can be designed to store binary data (one bit) or multilevel data (data having two or more bits).

The structure of the memory cell transistor MT is not limited to the structure having the floating gate electrode, and may also be a structure such as a metal-oxide-nitride-oxide-silicon (MONOS) structure in which the threshold value can be adjusted by trapping electrons in the interface of a nitride film as a charge storage layer. The memory cell transistor MT having this MONOS structure may also be designed to store one bit or multilevel data (data having two or more bits).

FIG. 3B shows an example of a threshold distribution obtained when a four-level data recording system is employed, i.e., a system wherein two bits are recorded in one memory transistor MT.

In the four-level data recording system, one of four-level data "xy" defined by upper page data "x" and lower page data "y" can be retained in memory cell transistor MT.

Data "11", "01", "00" and "10" (which are in the ascending order of the threshold voltage of the memory cell transistor MT) are assigned as the four-level data "xy". Data "11" represents an erase state where the threshold voltage of the memory cell transistor MT is negative.

In the lower page write, data "10" is written by selectively writing lower bit data "y" in the memory cell transistor MT which is in the data "11" state (erase state).

The threshold distribution of data "10", which is before the upper page write, is located between the threshold distributions of data "01" and data "00", which are after the upper page write. The threshold distribution of data "10" is allowed to be broader than the threshold distributions of data after the upper page write.

In the upper page write, upper bit data "x" is selectively written in the memory cell which is in the data "11" state and the memory cells which is in the data "10" state.

Each functional block in each embodiment of the present invention can be implemented by hardware, software, or a combination of the hardware and software. Therefore, each functional block will be explained below from the viewpoint of its function in order to clearly show that the block can be one or both of hardware and software. Whether the function is implemented as hardware or software depends on a practical embodiment or design limitations imposed on the whole system. Those skilled in the art can implement these functions by various methods for each practical embodiment, and the scope of the present invention includes determination of the implementation.

Figure 4:
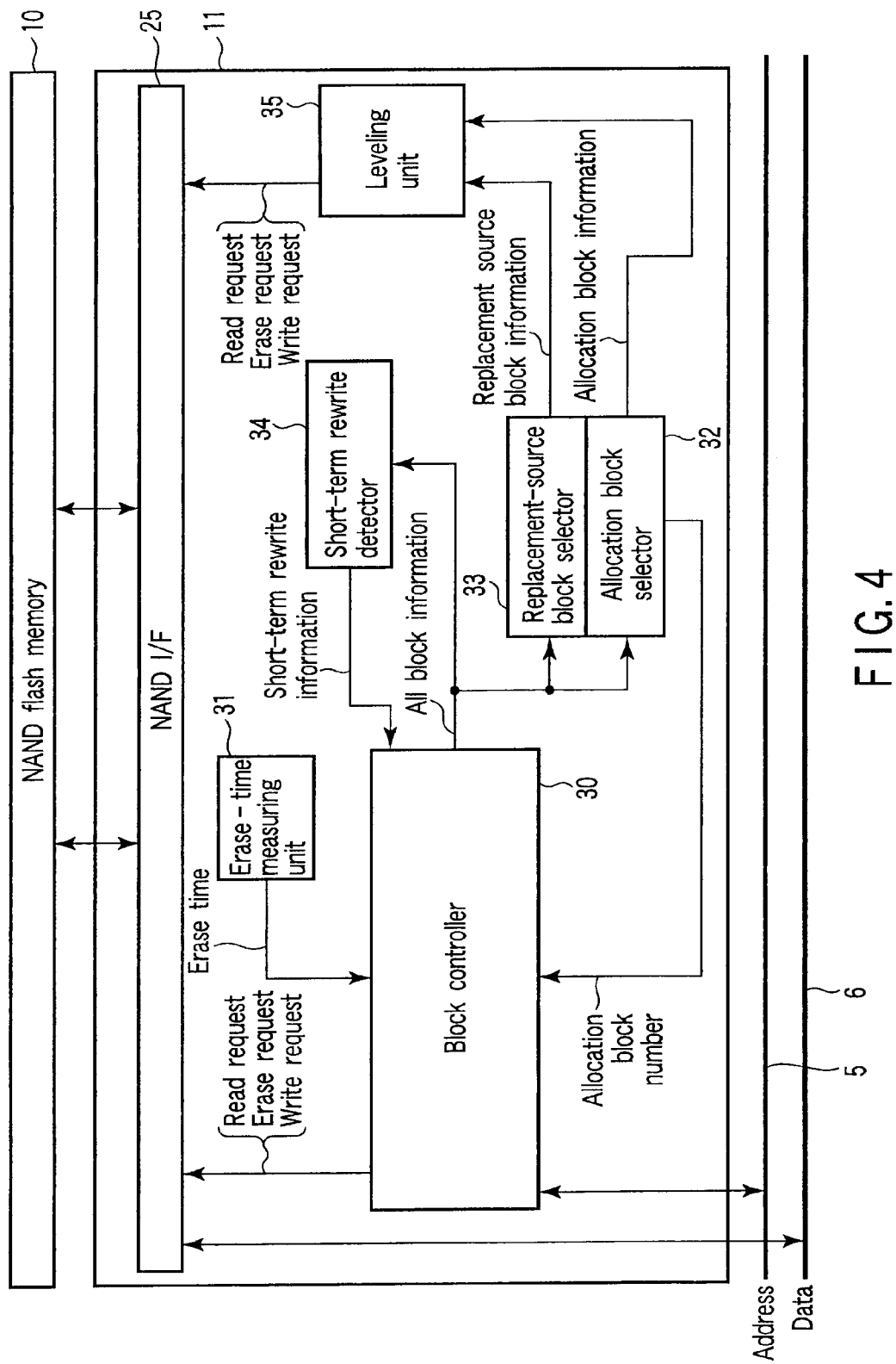
FIG. 4 is a block diagram showing an example of the arrangement of a NAND controller 11.

An example of a more practical arrangement of the NAND controller 11 will be explained below. FIG. 4 is a block diagram showing an example of the arrangement of the NAND controller 11 according to this embodiment.

The NAND controller 11 comprises a block controller 30, an erase-time measuring unit 31, an allocation block selector 32, a replacement-source block selector 33, a short-term rewrite detector 34, a leveling unit 35, and the NAND interface circuit (NAND I/F) 25.

Whenever data of each block included in the NAND flash memory 10 is erased, the erase-time measuring unit 31 measures the erase time of the block. The erase-time measuring unit 31 sends the measured erase time to the block controller 30.

The block controller 30 manages various kinds of information including the erase count and erase time. The block controller 30 also issues a write request, read request, and erase request to the NAND flash memory 10 in accordance with a transfer request from the CPU 2. More specifically, the block controller 30 includes an address table 30A and block table 30B (to be described later), and issues a write request, read request, and erase request to the NAND flash memory 10 by using these tables.

When writing new data supplied from the outside (e.g., the CPU 2 or main memory 3) into the NAND flash memory 10, the allocation block selector 32 selects a block. (to be referred to as an allocation block hereinafter) to be allocated to this write. That is, the allocation block selector 32 receives information (all block information) of all blocks stored in the block table 30B from the block controller 30, and selects an allocation block in accordance with predetermined conditions. The allocation block selector 32 sends a block number (allocation block number) corresponding to the allocation block to the block controller 30. Also, the allocation block selector 32 sends that information (allocation block information) of the all block information, which corresponds to the allocation block, to the leveling unit 35. Examples of the data to be written in the NAND flash memory 10 are user data externally supplied to the memory system 1, and system data required to manage the interior of the memory system 1.

The leveling unit 35 executes a leveling process (to be described later). Simultaneously with this leveling process, the leveling unit 35 issues a write request, read request, and erase request to the NAND flash memory 10. Note that leveling is to make the erase counts of blocks equal to each other (i.e., wear leveling). By thus making the block erase counts equal to each other, the concentration of erase processes to some blocks can be prevented. This makes it possible to extend the service life of the NAND flash memory 10.

The replacement-source block selector 33 selects a block (to be referred to as a replacement source block hereinafter) as a data replacement source to be used in the leveling process performed by the leveling unit 35. That is, the replacement-source block selector 33 receives the all block information from the block controller 30, and selects a replacement source block under predetermined conditions. Then, the replacement-source block selector 33 sends that information (replacement source block information) of the all block information, which corresponds to the replacement source block, to the leveling unit 35.

The NAND interface circuit 25 receives the write request, read request, and erase request from the block controller 30 and leveling unit 35. In response to these requests, the NAND interface circuit 25 instructs the NAND flash memory 10 to write, read, and erase data.

The short-term rewrite detector 34 detects a block (having a short erase interval) in which rewrite is frequently performed (within a short period). The erase time of a block in which rewrite is performed within a short period is frequently updated (replaced with a new one), whereas the erase time of a block in which rewrite is not performed within a short period remains old. This embodiment detects a block in which rewrite is performed within a short period by using the difference between the erase times. To this end, the short-term rewrite detector 34 arranges (sorts) blocks in use in order of erase time, and calculates the difference between the erase time of a certain search object block and that of a comparison object block having an erase time newest next to that of the search object block. If this erase time difference has exceeded a predetermined threshold value, the short-term rewrite detector 34 determines that the block whose erase time is newer than that of the comparison object block is a block in which rewrite is performed within a short period. This determination result is supplied as short-term rewrite information to the block controller 30.

Figure 5:
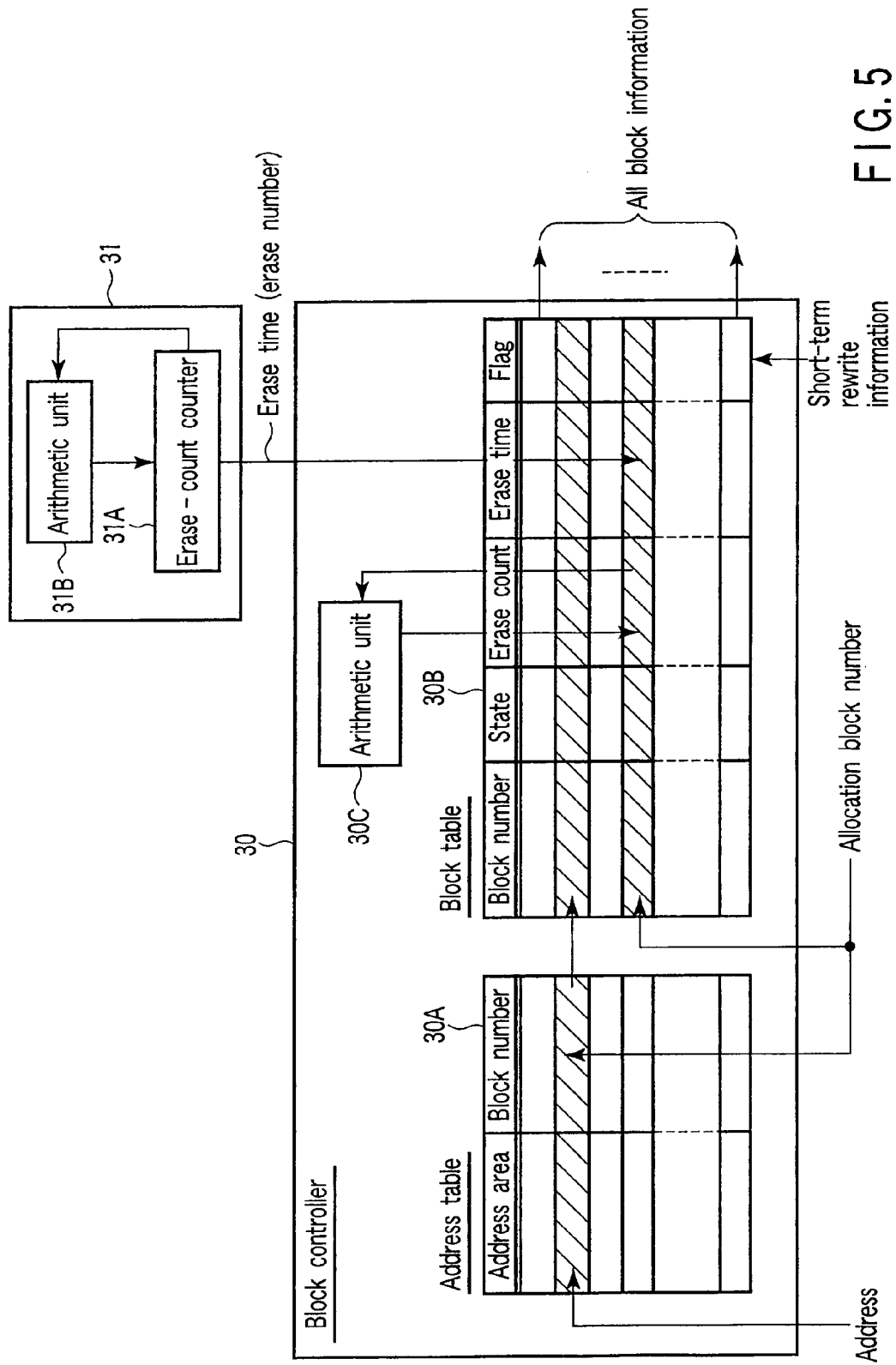
FIG. 5 is a block diagram showing the arrangements of a block controller 30 and erase-time measuring unit 31.

FIG. 5 is a block diagram showing the arrangements of the block controller 30 and erase-time measuring unit 31. The block controller 30 has the address table 30A, the block table 30B, and an arithmetic unit 30C. The block controller 30 receives externally supplied addresses and various kinds of information, and updates the address table 30A and block table 30B on the basis of these pieces of information.

The address table 30A shows the correspondence of an address area (logical block address) including an address supplied from the host device (CPU 2) via the address bus 5 to the number (physical block address) of that block in the NAND flash memory 10, which corresponds to the address area. By using the address table 30A, the block controller 30 can specify a block to which data in an address area including an address supplied from the host device corresponds. The address table 30A is updated simultaneously with, e.g., a block releasing process or block allocating process (to be described later).

The block table 30B stores the following data as information for each block number. The data contains a block state indicating whether the block number is not registered in the address table 30A (whether the block is a free block), or whether the block number is registered in the address table 30A (whether the block is in use), the number of times of erase of data (the erase count), the erase time supplied from the erase-time measuring unit 31, and a short-term rewrite flag (simply described as "Flag" in FIG. 5) corresponding to the short-term rewrite information supplied from the short-term rewrite detector 34. The block table 30B is updated simultaneously with, e.g., a block releasing process, block allocating process, block erasing process, and short-term rewrite detecting process (to be described later). The all block information contained in the block table 30B is supplied to the allocation block selector 32, replacement-source block selector 33, and short-term rewrite detector 34.

If a block is a free block, the host device recognizes that an address area corresponding to the block is a free area storing no data, regardless of whether data in the block is actually erased in the NAND flash memory 10. On the other hand, if a block is in use, the host device recognizes that an address area corresponding to the block is an area in use storing data.

Note that the address table 30A and block table 30B are actually stored in both the RAM 24 and NAND flash memory 10. However, the address table 30A and block table 30B stored as nonvolatile tables in the NAND flash memory 10 need not always be updated whenever the RAM 24 is updated.

Whenever data in the NAND flash memory 10 is erased, the arithmetic unit 30C counts up, by one, the erase count, which is contained in the block table 30B, of a block from which the data is erased. Note that the MPU 22 performs this processing of the arithmetic unit 30C in practice.

The block controller 30 receives an allocation block number from the allocation block selector 32, and updates the block number in the address table 30A by using this allocation block number. Also, the block controller 30 issues a write request for this allocation block to the NAND flash memory 10. In addition, the block controller 30 issues a normal read request and erase request corresponding to an external address to the NAND flash memory 10.

The erase-time measuring unit 31 comprises an erase-count counter 31A for counting the number of times of erase, and an arithmetic unit 31B for updating the count of the erase-count counter 31A. The erase-time measuring unit 31 measures the number of times of erase performed on a block in the NAND flash memory 10, and outputs the measured value as the erase time.

More specifically, whenever data in a certain block is erased, the arithmetic unit 31B counts up the erase-count counter 31A by one. The count (erase number) of the erase-count counter 31A is supplied as the erase time to the block controller 30 (i.e., the block table 30B). In the erase-time measuring unit 31 of this embodiment, the smaller the erase number, the older the erase time. Note that the MPU 22 actually performs this processing of the arithmetic unit 31B.

As the erase time, it is also possible to use, e.g., the time (erase timing) at which data is erased, or the power supply time of the NAND controller 11. When using the erase timing as the erase time, the erase-time measuring unit 31 includes a clock, and, whenever data is erased, outputs the timing of erase as the erase time. When using the power supply time as the erase time, the erase-time measuring unit 31 includes a timer, and, whenever data is erased, measures the power supply time up to this point, and outputs the measured power supply time as the erase time. It is thus possible to freely select the erase count, erase timing, or power supply time as the erase time. Note that information other than the three types of information described above may also be used as long as the erase time can be specified.

[2. Write Operation of NAND Controller 11]

Figure 6:
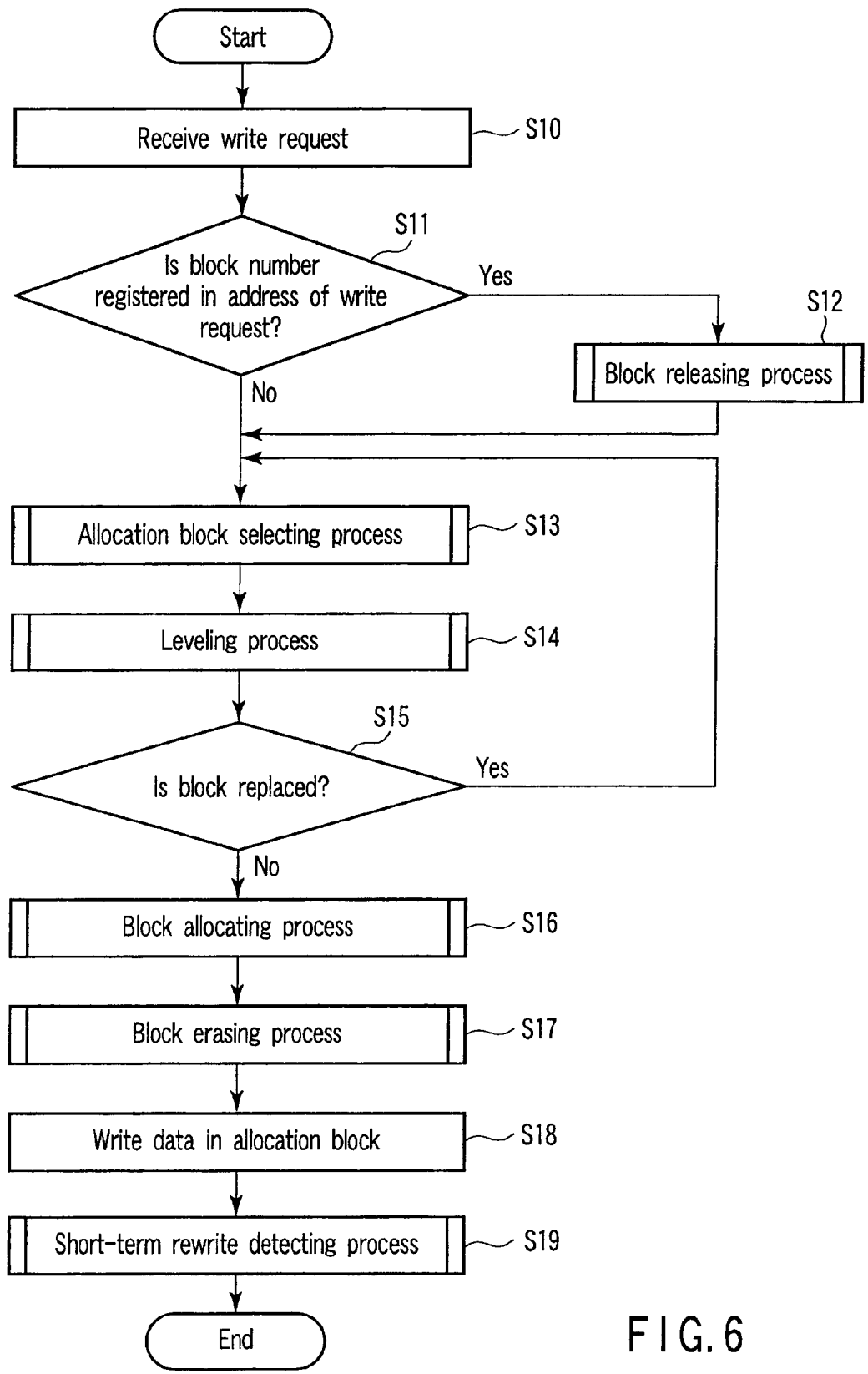
FIG. 6 is a flowchart showing the sequence of a write operation performed by the NAND controller 11.

The write operation of the NAND controller 11 will be explained below. FIG. 6 is a flowchart showing the sequence of the write operation performed by the NAND controller 11.

First, the NAND controller 11 starts the write operation upon receiving a write request from the CPU 2 (step S10). Subsequently, the block controller 30 checks whether a block number is registered (a block is allocated) for an address area containing the address of the write request by using the address table 30A (step S11). If a block number is registered (a block is allocated), data must be overwritten in this address area, so the block controller 30 executes a block releasing process of releasing a block corresponding to the block number (step S12).

If it is determined in step S11 that no block number is registered (no block is allocated), or after the block releasing process is executed in step S12, the allocation block selector 32 executes an allocation block selecting process of selecting a block (allocation block) to be allocated to the address area (step S13).

Then, the leveling unit 35 and replacement-source block selector 33 execute a leveling process (step S14). After that, the block controller 30 checks whether the allocation block is replaced in the leveling process (step S15). If the allocation block is replaced, the process returns to step S13, and the allocation block selector 32 executes the allocation block selecting process again.

If it is determined in step S15 that the allocation block is not replaced, the block controller 30 executes a block allocating process by using a block number (allocation block number) corresponding to the allocation block, in order to update the address table 30A and block table 30B (step S16). The block controller 30 then executes a block erasing process on the allocation block (step S17).

Subsequently, the block controller 30 writes new data in the allocation block from which data is erased (step S18). That is, the block controller 30 issues a write request to the NAND interface circuit 25. On the basis of this write request, the NAND interface circuit 25 instructs the NAND flash memory 10 to write the new data in the allocation block.

After that, the short-term rewrite detector 34 executes a short-term rewrite detecting process (step S19). The block controller 30 updates the flag in the block table 30B by using short-term rewrite information supplied from the short-term rewrite detector 34. In this manner, the NAND controller 11 executes the sequence of the write operation.

The details of each processing included in the write operation will now be explained.

[2-1. Block Releasing Process]

Figure 7:
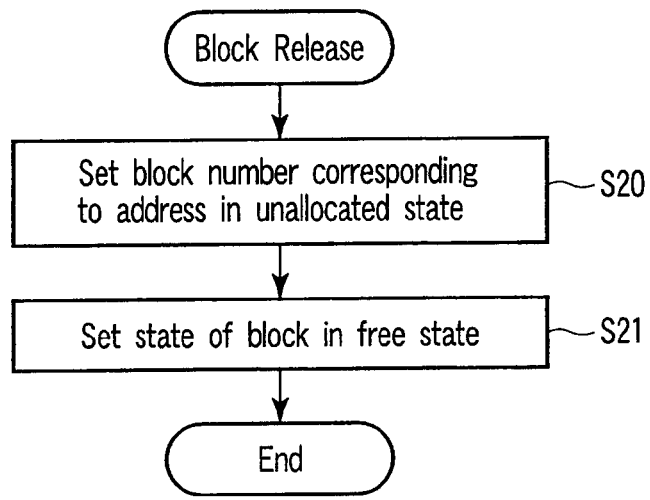
FIG. 7 is a flowchart showing a block releasing process performed by the NAND controller 11.

FIG. 7 is a flowchart showing the block releasing process performed by the NAND controller 11. The block controller 30 sets, in an unallocated state, the block number contained in the address table 30A and corresponding an address area containing the address of a write request (step S20). Subsequently, the block controller 30 sets the state of the block number contained in the block table 30B to a free state (step S21). A block newly set in the free state by the block releasing process will be called a released block hereinafter. After that, the NAND controller 11 can write new data in the released block.

[2-2. Allocation Block Selecting Process]

Figure 8:
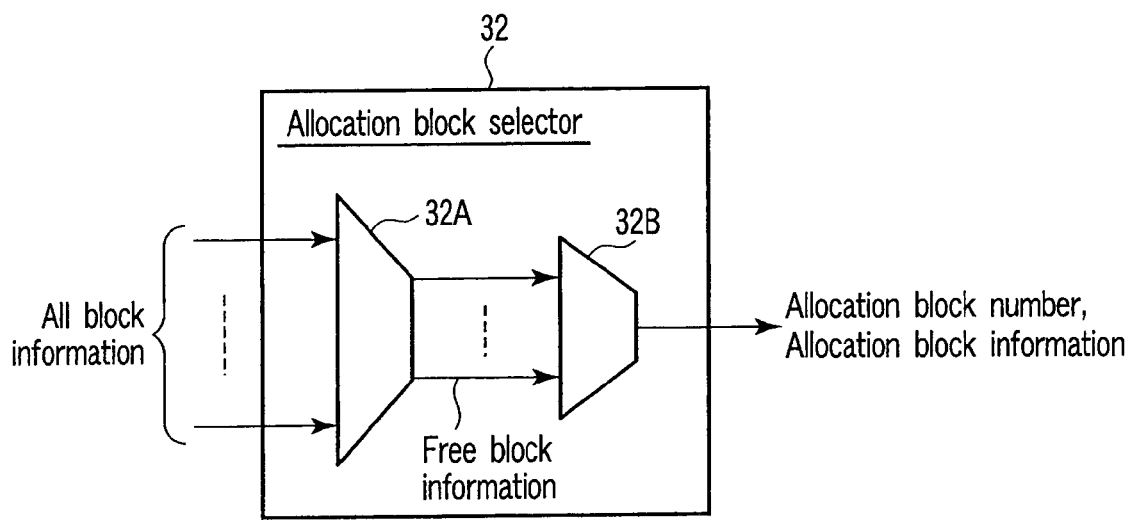
FIG. 8 is a block diagram showing the arrangement of an allocation block selector 32.
Figure 9:
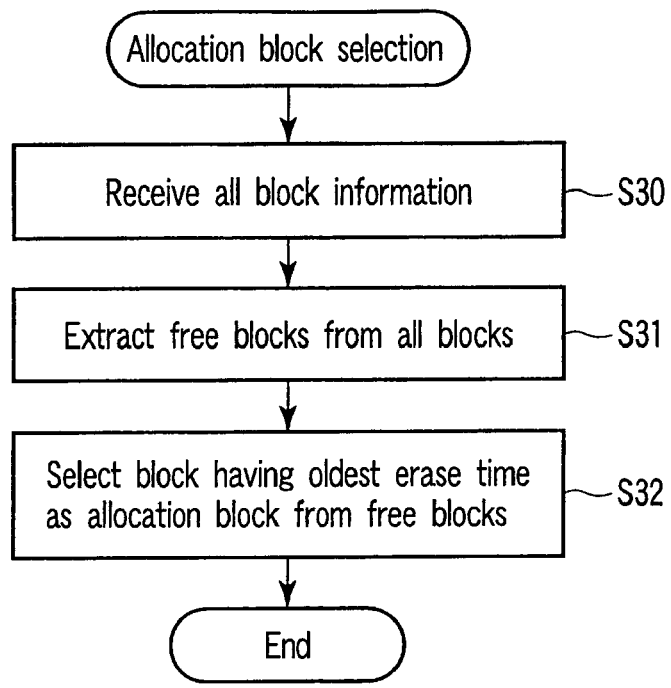
FIG. 9 is a flowchart showing an allocation block selecting process performed by the allocation block selector 32.

FIG. 8 is a block diagram showing the arrangement of the allocation block selector 32. FIG. 9 is a flowchart showing the allocation block selecting process performed by the allocation block selector 32.

The allocation block selector 32 comprises two selectors 32A and 32B. The allocation block selector 32 receives the all block information from the block controller 30 (step S30). This all block information is supplied to the selector 32A. The selector 32A checks the states of all blocks, and extracts free blocks from all the blocks (step S31). The selector 32A then sends block information (free block information) corresponding to the free blocks to the selector 32B.

The selector 32B selects a block having the oldest erase time as an allocation block from the blocks extracted by the selector 32A (step S32). An allocation block number corresponding to this allocation block is supplied to the block controller 30. Also, allocation block information corresponding to the allocation block is supplied to the leveling unit 35.

[2-3. Block Allocating Process]

Figure 10:
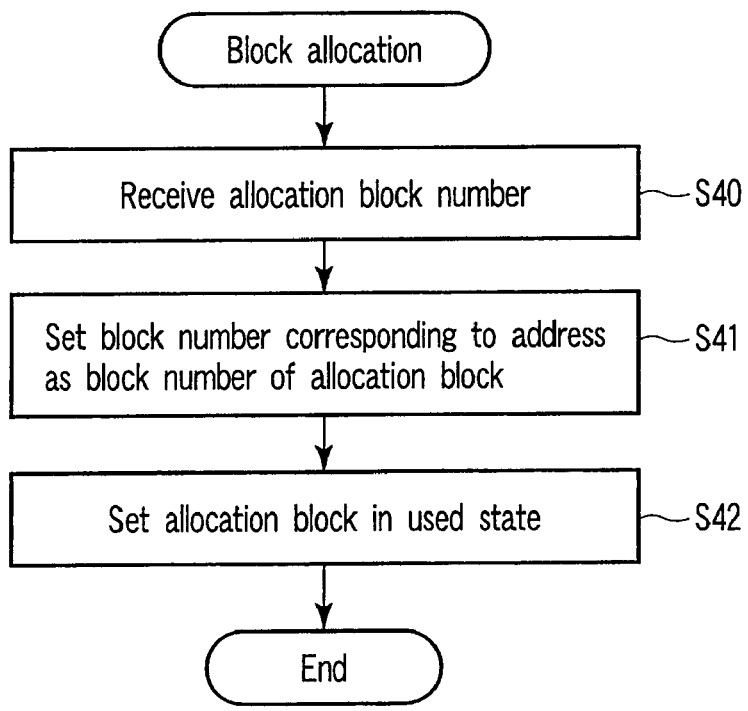
FIG. 10 is a flowchart showing a block allocating process performed by the NAND controller 11.

FIG. 10 is a flowchart showing the block allocating process performed by the NAND controller 11. The NAND controller 11 updates information in the address table 30A and block table 30B, for the allocation block selected by the allocation block selector 32.

First, the block controller 30 receives the allocation block number from the allocation block selector 32 (step S40). Then, the block controller 30 sets the block number of the allocation block in an address area containing the address of the write request contained in the address table 30A (step S41). Subsequently, the block controller 30 sets the state of the allocation block contained in the block table 30B to a used state (step S42). In this way, the allocation block selected by the allocation block selector 32 is changed from the free state to the used state.

[2-4. Block Erase State]

Figure 11:
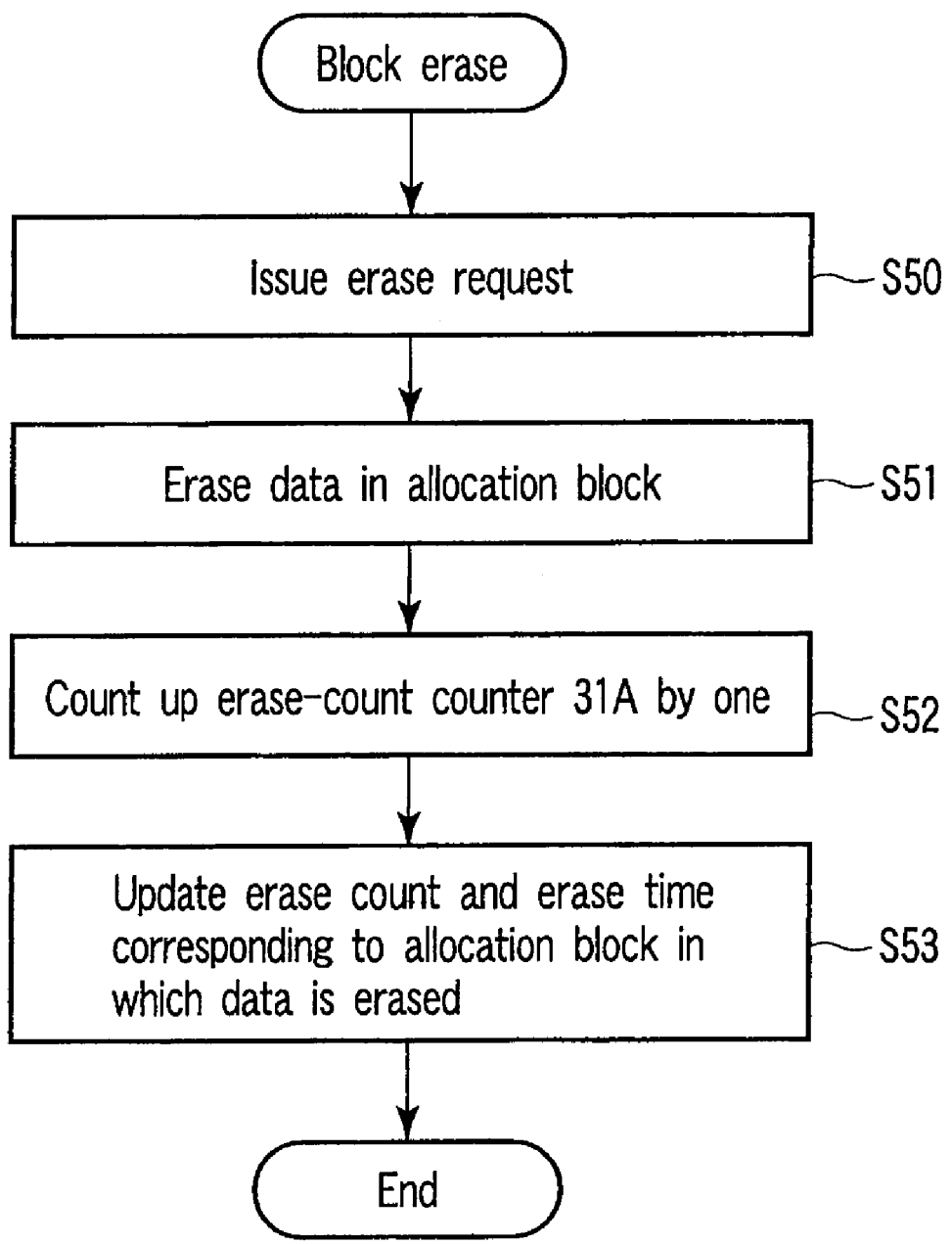
FIG. 11 is a flowchart showing a block erasing process performed by the NAND controller 11.

FIG. 11 is a flowchart showing the block erasing process performed by the NAND controller 11. The block controller 30 issues an erase request for the allocation block to the NAND interface circuit 25 (step S50). On the basis of this erase request, the NAND interface circuit 25 instructs the NAND flash memory 10 to erase data in the allocation block (step S51). Subsequently, the erase-time measuring unit 31 (more specifically, the arithmetic unit 31B) counts up the count (erase number) of the erase-count counter 31A by one (step S52).

Then, the block controller 30 updates the erase count and erase time contained in the block table 30B and corresponding to the allocation block from which the data is erased (step S53). More specifically, the block controller 30 updates the erase time contained in the block table 30B and corresponding to the block number of the allocation block, by using the erase time supplied from the erase-time measuring unit 31. Also, the arithmetic unit 30C counts up the erase count contained in the block table 30B and corresponding to the block number of the allocation block by one.

[2-5. Short-Term Rewrite Detecting Process]

Figure 12:
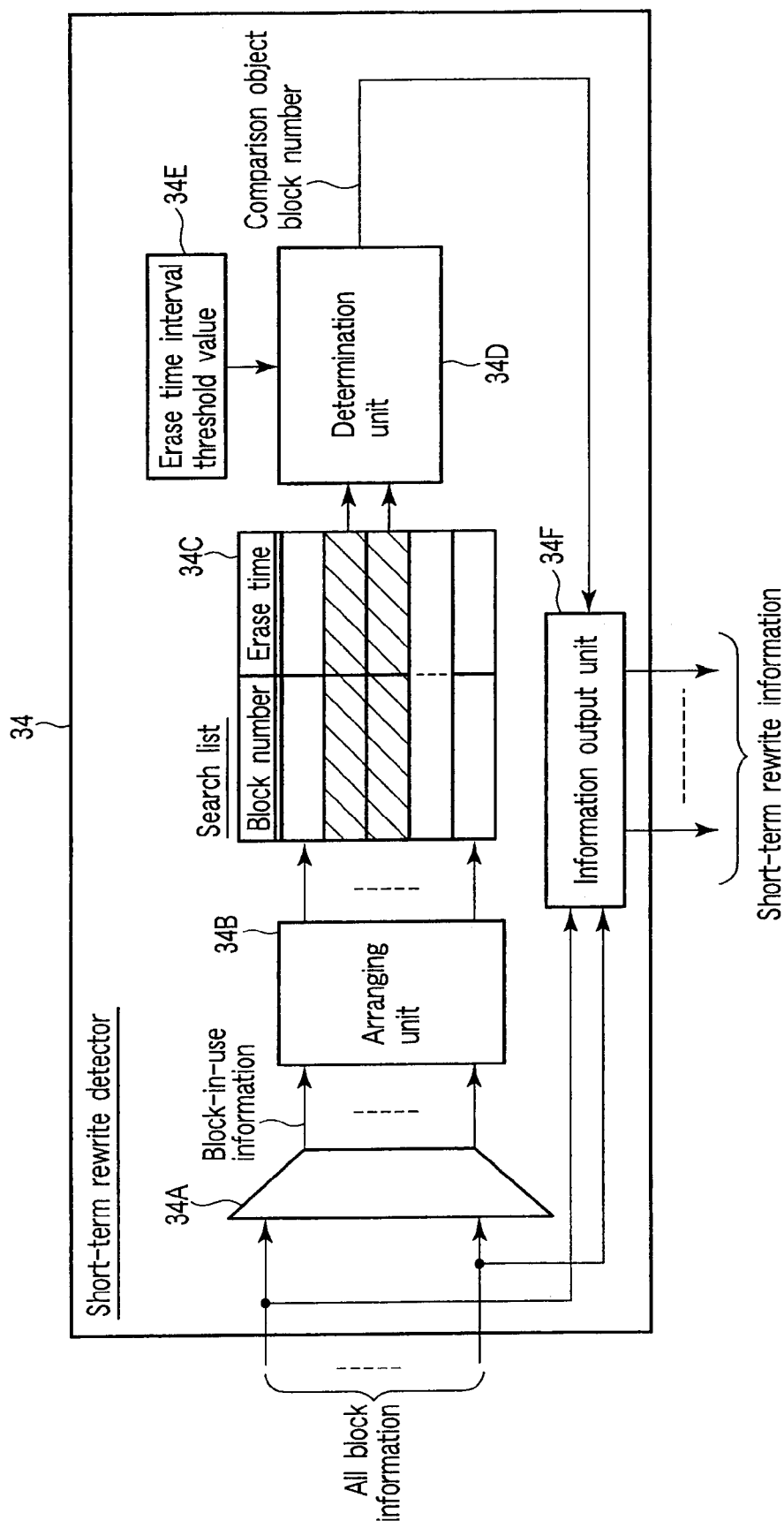
FIG. 12 is a block diagram showing the arrangement of a short-term rewrite detector 34.

FIG. 12 is a block diagram showing the arrangement of the short-term rewrite detector 34. The short-term rewrite detector 34 comprises a selector 34A, an arranging unit 34B, a search list 34C, a determination unit 34D, a storage unit 34E for storing an erase time interval threshold value, and an information output unit 34F.

The selector 34A checks the states of all blocks by using the all block information supplied from the block controller 30, and extracts blocks in use from all the blocks. The arranging unit 34B arranges (sorts) the blocks in use in order of erase time. The search list 34C temporarily stores the sorted block information. Note that the search list 34C is actually stored in the RAM 24.

In the search list 34C, the determination unit 34D selects a block having the newest erase time as "a search object block", and a block having an erase time newest next to that of the search object block as "a comparison object block". In addition, the determination unit 34D calculates the difference between the erase times of the search object block and comparison object block, and determines whether the difference has exceeded the erase time interval threshold value. On the basis of this determination result, the determination unit 34D searches for a boundary where the erase time abruptly changes.

By using the determination result (the number of the comparison object block) supplied from the determination unit 34D, the information output unit 34F calculates the range of blocks having erase times newer than that of the comparison object block among all the blocks. The information output unit 34F sends the above range as short-term rewrite information to the block controller 30.

The erase time interval threshold value stored in the storage unit 34E is used to specify the range of blocks in which data is frequently rewritten, and set on the basis of a criterion indicating a degree to which the service life (or the data retention period) of the NAND flash memory 10 is to be extended. The possibility of short-term rewrite detection increases when the erase time interval threshold value is decreased, and decreases when the threshold value is increased. That is, the number of times of the leveling process increases when the erase time interval threshold value is decreased, and decreases when the threshold value is increased. This leveling process is accompanied by a block data erasing process.

Whenever data is erased, the retention characteristic of the NAND flash memory 10 degrades (i.e., the service life shortens). On the other hand, when the erase interval prolongs, the retention characteristic of the NAND flash memory 10 recovers. That is, if data erase is successively performed at short intervals, the recovery time of the retention characteristic cannot be secured, so the service life of the NAND flash memory 10 shortens. In this embodiment, therefore, short-term rewrite flags are set for blocks in which data is frequently rewritten, thereby setting these blocks as objects of leveling. The erase time interval threshold value indicating the degree of recovery of the service life obtained by prolonging the erase interval by a predetermined time is determined, so as to optimize blocks to be leveled and the number of times of leveling, by taking account of the characteristics of the NAND flash memory 10.

Figure 13:
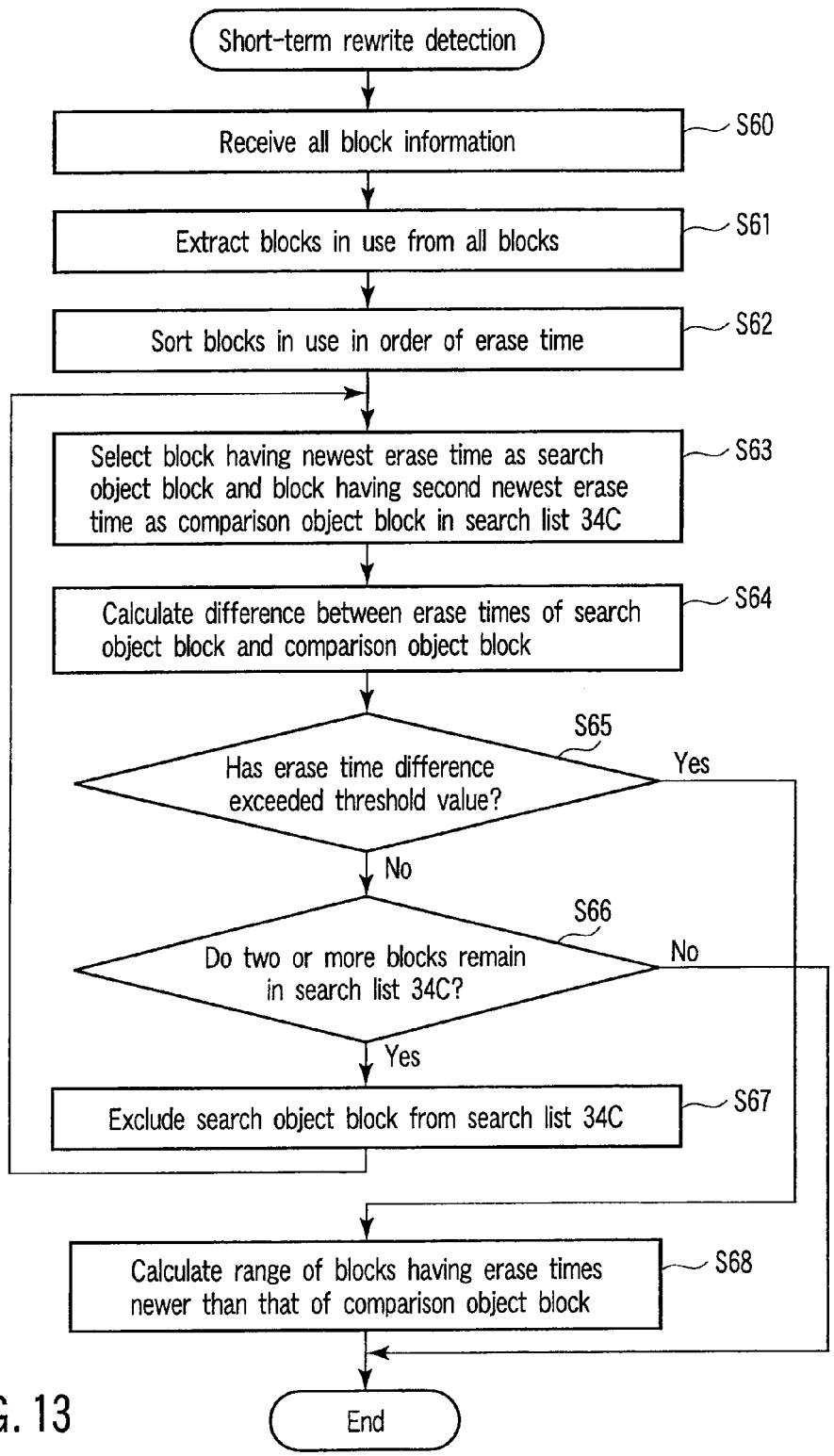
FIG. 13 is a flowchart showing a short-term rewrite detecting process performed by the short-term rewrite detector 34.

FIG. 13 is a flowchart showing the short-term rewrite detecting process performed by the short-term rewrite detector 34. First, the short-term rewrite detector 34 receives the all block information from the block controller 30 (step S60). This all block information is supplied to the selector 34A. The selector 34A checks the states of all blocks, and extracts blocks in use from all the blocks (step S61). Then, the selector 34A sends block information (block-in-use information) corresponding to the blocks in use to the arranging unit 34B.

The arranging unit 34B checks the erase times contained in the block-in-use information, and sorts the blocks in use in order of erase time (step S62). The block information sorted by the arranging unit 34B is placed in the search list 34C.

Subsequently, the determination unit 34D selects, in the search list 34C, a block having the newest erase time as a search object block, and a block having an erase time newest next to that of the search object block as a comparison object block (step S63).

After that, the determination unit 34D calculates the difference between the erase times of the search object block and comparison object block (step S64). Then, the determination unit 34D checks whether the calculated erase time difference has exceeded the erase time interval threshold value (step S65). If the difference has not exceeded the erase time interval threshold value, the determination unit 34D checks whether two or more blocks remain in the search list 34C (step S66). If two or more blocks remain, the determination unit 34D excludes the search object block from the search list 34C, returns to step S63, and selects a search object block and comparison object block again.

If the difference has exceeded the erase time interval threshold value in step S65, the determination unit 34D sends the comparison object block number to the information output unit 34F. By using this comparison object block number, the information output unit 34F calculates the range of blocks having erase times newer than that of the comparison object block among all the blocks (step S68). The information output unit 34F sends the above range as short-term rewrite information to the block controller 30. Upon receiving this short-term rewrite information, the block controller 30 sets short-term rewrite flags corresponding to the blocks contained in the short-term rewrite information, and clears short-term rewrite flags corresponding to other blocks.

If two or more blocks do not remain in step S66, it is determined that no block having undergone short-term rewrite can be detected, and the short-term rewrite detecting process is terminated.

FIG. 14 is a view for explaining a practical example of the short-term rewrite detecting process performed by the short-term rewrite detector 34. Assume that the NAND flash memory 10 includes 12 blocks (blocks #0 to #11), blocks #0 to #7 are blocks in use contained in the search list 34C, and blocks #8 to #11 are free blocks. Blocks #0 to #7 are sorted in order from a block having the newest erase time. The erase times of the individual blocks are as shown in FIG. 14.

First, in the search list 34C, block #0 having the newest erase time is selected as a search object block, and block #1 having the second newest erase time is selected as a comparison object block. The difference between the erase times of blocks #0 and #1 is "10". This difference "10" has not exceeded the erase time interval threshold value (e.g., "100"). Accordingly, search object block #0 is excluded from the search list 34C.

Subsequently, in the search list 34C, block #1 having the newest erase time is selected as a search object block, and block #2 having the second newest erase time is selected as a comparison object block. The difference between the erase times of blocks #1 and #2 is "110". This difference "110" has exceeded the erase time interval threshold value. Therefore, the number of comparison object block #2 is supplied from the determination unit 34D to the information output unit 34F.

Of all the blocks including free blocks, the information output unit 34F performs calculations on blocks #0, #1, and #8 to #11 having erase times newer than that of comparison object block #2. The information output unit 34F sends blocks #0, #1, and #8 to #11 as short-term rewrite information to the block controller 30. The block controller 30 sets short-term rewrite flags corresponding to blocks #0, #1, and #8 to #11, and clears short-term rewrite flags corresponding to other blocks. Thus, the information in the block table 30B is updated.

[2-6. Leveling Process]

To prolong the service life of the NAND flash memory 10, it is necessary to make the erase counts of the individual blocks equal, and avoid frequent rewrite in a specific area within a short period. If the service life of the NAND flash memory 10 is extended by noting only equalization of the erase counts, rewrite may progress in a specific area within a short time depending on the write status. If correction (leveling) is frequently performed within a short period, it is possible to make the erase counts equal and avoid write concentration to a specific area within a short time. However, the correction increases the number of times of erase, and this makes it impossible to prolong the service life. On the other hand, if the correction interval is extended too much, short-interval erase processes concentrate to a specific area, and this shortens the service life. On the basis of these findings, in the leveling process of this embodiment, the number of times of leveling is optimized, and the erase counts of the individual blocks are made equal.

Figure 15:
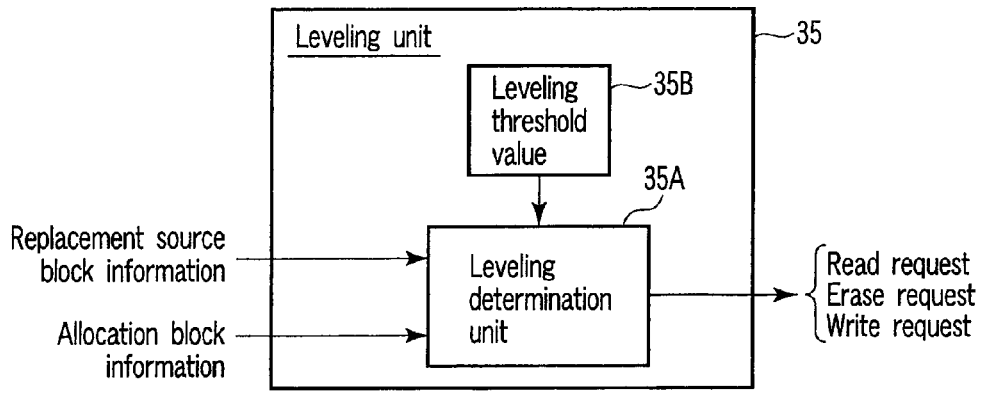
FIG. 15 is a block diagram showing the arrangement of a leveling unit 35.

The leveling unit 35 and replacement-source block selector 33 execute the leveling process. FIG. 15 is a block diagram showing the arrangement of the leveling unit 35. The leveling unit 35 comprises a leveling determination unit 35A, and a storage unit 35B for storing a leveling threshold value.

The leveling determination unit 35A determines whether to perform the leveling process during the present write operation by using the leveling threshold value, the allocation block information supplied from the allocation block selector 32, and the replacement source block information supplied from the replacement-source block selector 33. When performing the leveling process, the leveling determination unit 35A issues a read request, erase request, and write request associated with the leveling process, to the NAND interface circuit 25.

Figure 16:
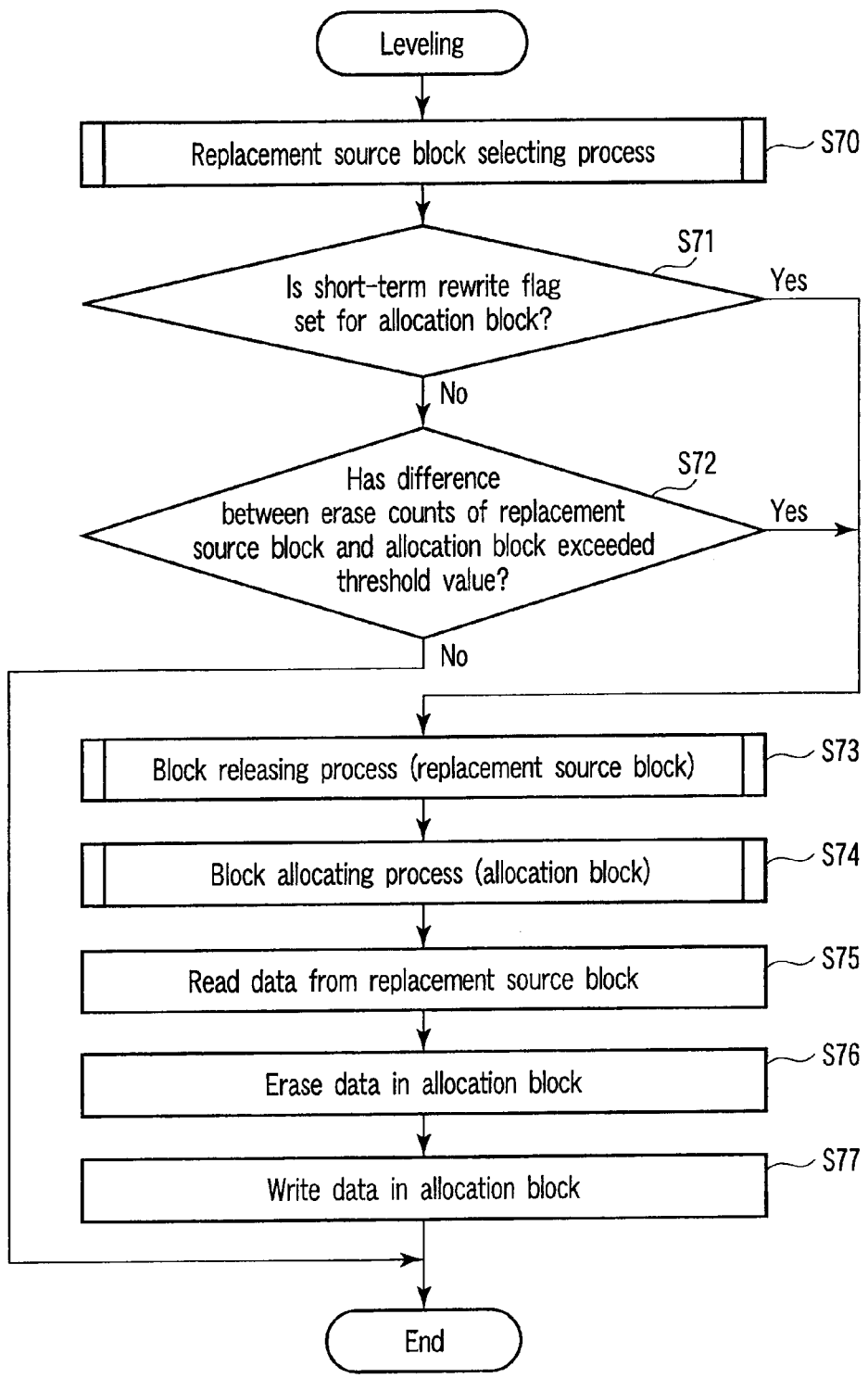
FIG. 16 is a flowchart showing a leveling process performed by the NAND controller 11.

FIG. 16 is a flowchart showing the leveling process performed by the NAND controller 11. First, the replacement-source block selector 33 executes the replacement source block selecting process (step S70). As a result of this selecting process, the replacement source block information is supplied from the replacement-source block selector 33 to the leveling unit 35.

Subsequently, the leveling determination unit 35A checks the allocation block information supplied from the allocation block selector 32, and determines whether the short-term rewrite flag contained in this allocation block information is ON (step S71). If the short-term rewrite flag is OFF, i.e., if rewrite of the allocation block is not frequently performed, the leveling determination unit 35A determines whether the difference between the erase counts of the replacement source block and allocation block has exceeded the leveling threshold value (step S72). If the different has not exceeded the leveling threshold value, the leveling unit 35 performs no leveling in the present write operation.

This leveling threshold value is used to determine whether to execute the leveling process, and set on the basis of the criterion indicating a degree to which the service life (or the data retention period) of the NAND flash memory 10 is to be extended. As described previously, if the service life of the NAND flash memory 10 is prolonged by noting only equalization of the erase counts, data erase occurs many times due to leveling, and this increases the number of times of erase in a specific area. In this embodiment, therefore, the leveling process is executed only when the difference between the erase counts of the replacement source block and allocation block has exceeded the leveling threshold value.

If the short-term rewrite flat is ON in step S71, or if the leveling threshold value is exceeded in step S72, the block controller 30 executes a block releasing process on the replacement source block (step S73). This block releasing process is the same as that shown in FIG. 7.

Subsequently, the block controller 30 executes a block allocating process of allocating the allocation block selected by the allocation block selector 32 as a block to which data of the replacement source block is to be moved (step S74). This block allocating process is the same as that shown in FIG. 10.

Then, the NAND controller 11 reads the data of the replacement source block included in the NAND flash memory 10 (step S75). More specifically, the leveling determination unit 35A issues a read request to the NAND interface circuit 25 by using the replacement source block information supplied from the replacement-source block selector 33. On the basis of this read request, the NAND interface circuit 25 instructs the NAND flash memory 10 to read the data from the replacement source block. The read data is temporarily stored in, e.g., the RAM 24.

After that, the NAND controller 11 erases data of the allocation block (step S76). More specifically, the leveling determination unit 35A issues an erase request to the NAND interface circuit 25 by using the allocation block information supplied from the allocation block selector 32. On the basis of this erase request, the NAND interface circuit 25 instructs the NAND flash memory 10 to erase the data of the allocation block. In this step, the block controller 30 updates the erase count and erase time of the allocation block (FIG. 11).

Subsequently, the NAND controller 11 writes the data read from the replacement source block into the allocation block included in the NAND flash memory 10 (step S77). More specifically, the leveling determination unit 35A issues a write request to the NAND interface circuit 25 by using the allocation block information. On the basis of this write request, the NAND interface circuit 25 instructs the NAND flash memory 10 to write the data in the allocation block.

The above processing makes it possible to move data of a replacement source block to an allocation block, and use the replacement source block as a free block. Accordingly, a replacement source block in which rewrite is presumably not frequently performed can be reused as an allocation block. Also, data that is not frequently rewritten is moved to an allocation block already having a large erase count. This makes it possible to prevent the increase in erase count of the allocation block in the future.

[2-6-1. Replacement Source Block Selecting Process]

Figure 17:
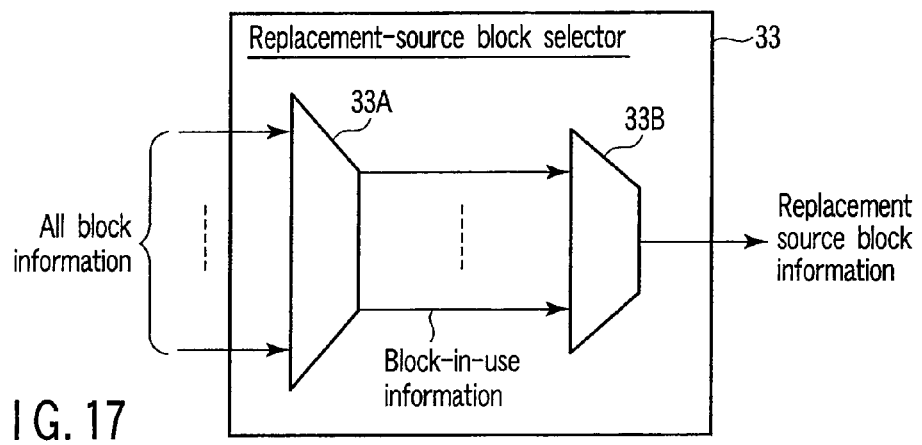
FIG. 17 is a block diagram showing the arrangement of a replacement-source block selector 33.
Figure 18:
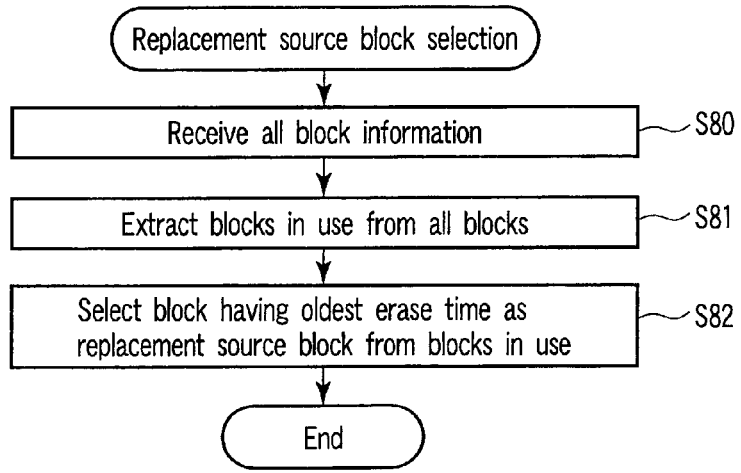
FIG. 18 is a flowchart showing a replacement source block selecting process performed by the replacement-source block selector 33.

FIG. 17 is a block diagram showing the arrangement of the replacement-source block selector 33. FIG. 18 is a flowchart showing the replacement source block selecting process performed by the replacement-source block selector 33.

The replacement-source block selector 33 comprises two selectors 33A and 33B. The replacement-source block selector 33 receives the all block information from the block controller 30 (step S80). This all block information is supplied to the selector 33A. The selector 33A checks the states of all blocks, and extracts blocks in use from all the blocks (step S81). The selector 33A then sends block information (block-in-use information) corresponding to the blocks in use to the selector 33B.

From the blocks extracted by the selector 33A, the selector 33B selects a block having the oldest erase time as a replacement source block (step S82). Replacement source block information corresponding to this replacement source block is supplied to the leveling circuit 35. The replacement source block selecting process as described above makes it possible to select, as a replacement source block, a block storing data that is not frequently rewritten, and having a good retention characteristic.

In this embodiment as described in detail above, the erase time at which data is erased from each block is measured, and the blocks and erase times are stored in the block table 30B as they are associated with each other. When writing externally supplied data in the NAND flash memory 10, a free block having the oldest erase time is selected as an allocation block, and the data is written in this allocation block.

Accordingly, this embodiment can extend the erase interval of each block. This makes it possible to reduce the deterioration of the retention characteristic of each block by using the memory cell transistor characteristic that the retention characteristic is recovered by extending the erase interval. Consequently, the service life of the NAND flash memory 10 can be prolonged.

Also, in this embodiment, the short-term rewrite detector 34 specifies a block in which data is frequently rewritten. If this block is selected as an allocation block, the allocation block is replaced with a replacement source block having an old erase time, and data that is stored in the replacement source block and is not frequently replaced is moved to the allocation block. As a consequence, even a replacement source block that has not been released for a long time period after being allocated once by write is released by the leveling process. Therefore, a replacement source block in which data is presumably not frequently rewritten can be reused as an allocation block. In addition, data that is not frequently rewritten is stored in an allocation block. This makes it possible to reduce the number of times of data erase after that, and reduce the deterioration of the retention characteristic of the allocation block.

Furthermore, the leveling process is performed when the difference between the erase counts of a replacement source block and allocation block has exceeded the threshold value. This makes it possible to optimize the number of times of leveling because leveling is not frequently performed, and make the erase counts of blocks equal to each other. Consequently, it is possible to prevent the service life of the whole NAND flash memory 10 from being shortened by increasing the erase counts of some blocks.

In the case where multi-level data recording system is applied, fine control is required for the threshold distributions of the transistors MT of a memory cell. It is therefore advantageous to prevent the degradation of the retention characteristics.

Second Embodiment

The second embodiment discloses another example of the allocation block selecting process performed by the allocation block selector 32. That is, a block having an old erase time and a small erase count is selected as an allocation block.

Figure 19:
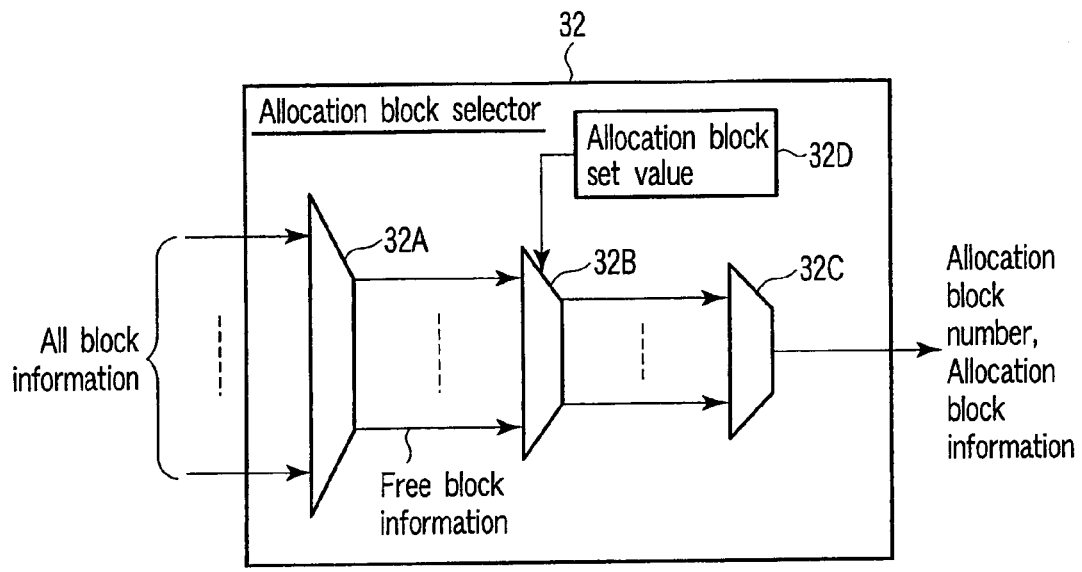
FIG. 19 is a block diagram showing the arrangement of an allocation block selector 32 according to the second embodiment of the present invention.
Figure 20:
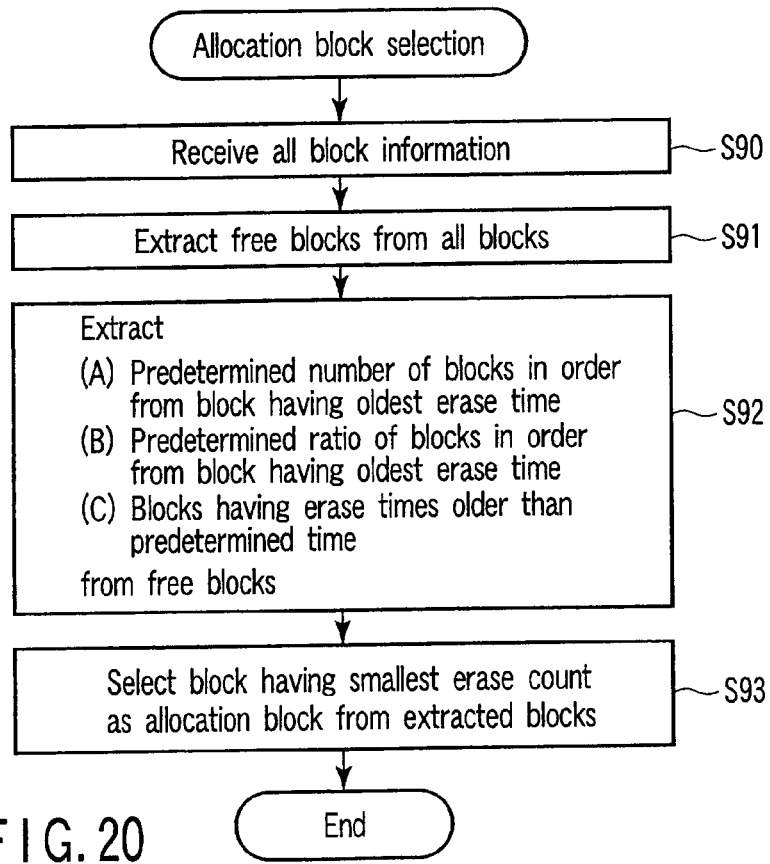
FIG. 20 is a flowchart showing an allocation block selecting process performed by the allocation block selector 32 according to the second embodiment.

FIG. 19 is a block diagram showing the arrangement of an allocation block selector 32 according to the second embodiment. FIG. 20 is a flowchart showing an allocation block selecting process performed by the allocation block selector 32. Note that the arrangement of a NAND controller 11 is the same as that of the first embodiment except for the allocation block selector 32.

The allocation block selector 32 comprises three selectors 32A to 32C, and a storage unit 32D for storing an allocation block set value. The allocation block selector 32 receives all block information from a block controller 30 (step S90). This all block information is supplied to the selector 32A. The selector 32A checks the states of all blocks, and extracts free blocks from all the blocks (step S91). The selector 32A then sends block information (free block information) corresponding to the free blocks to the selector 32B.

The selector 32B extracts, from the free block information, block information meeting a condition set by the allocation block set value (step S92). The allocation block set value is one of:
(A) A predetermined number of blocks starting from a block having the oldest erase time
(B) A predetermined ratio of blocks starting from a block having the oldest erase time
(C) Blocks having erase times older than a predetermined time An arbitrary one of conditions (A) to (C) can be selected as the allocation block set value. For example, when using condition (A) as the allocation block set value, the selector 32B extracts, from free blocks, a predetermined number of blocks in order from a block having the oldest erase time. The selector 32B then sends block information corresponding to the extracted blocks to the selector 32C.

Under conditions (A) and (B), free blocks are sorted in order of erase time, and a predetermined number/ratio of blocks are searched for in order from a block having the oldest erase time. Accordingly, it is possible to increase the number of blocks selected in step S92, and increase the probability that a block having a small erase count is selected in step S93. Under condition (C), only free blocks whose erase times have exceeded a predetermined time need be sorted, so the processing load is lowest. Also, while a predetermined number/ratio of blocks are always extracted in order from a block having the oldest erase time under conditions (A) and (B), blocks having erase times older than a predetermined time are extracted under condition (C). Under condition (C), therefore, an erase interval is always a predetermined interval, so the number of candidates for comparison of erase counts can be reduced accordingly.

Subsequently, the selector 32C selects, as an allocation block, a block having the smallest erase count from the blocks extracted by the selector 32B (step S93). An allocation block number corresponding to this allocation block is supplied to the block controller 30. Also, allocation block information corresponding to the allocation block is supplied to a leveling unit 35.

In this embodiment as described in detail above, when selecting an allocation block for writing externally supplied data in it, a block having an old erase time and a small erase count can be selected as the allocation block from free blocks. This makes it possible to write external data in a block having a good retention characteristic, and prolong the service life of a NAND flash memory 10.

Third Embodiment

The third embodiment discloses another example of the replacement source block selecting process performed by the replacement-source block selector 33. That is, a block having an old erase time and a small erase count is selected as a replacement source block.

Figure 21:
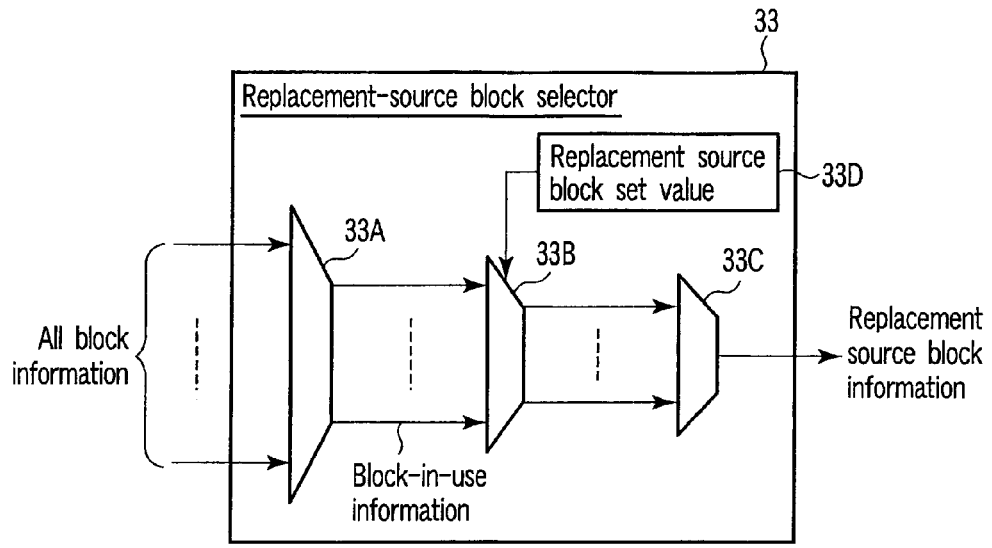
FIG. 21 is a block diagram showing the arrangement of a replacement-source block selector 33 according to the third embodiment of the present invention.
Figure 22:
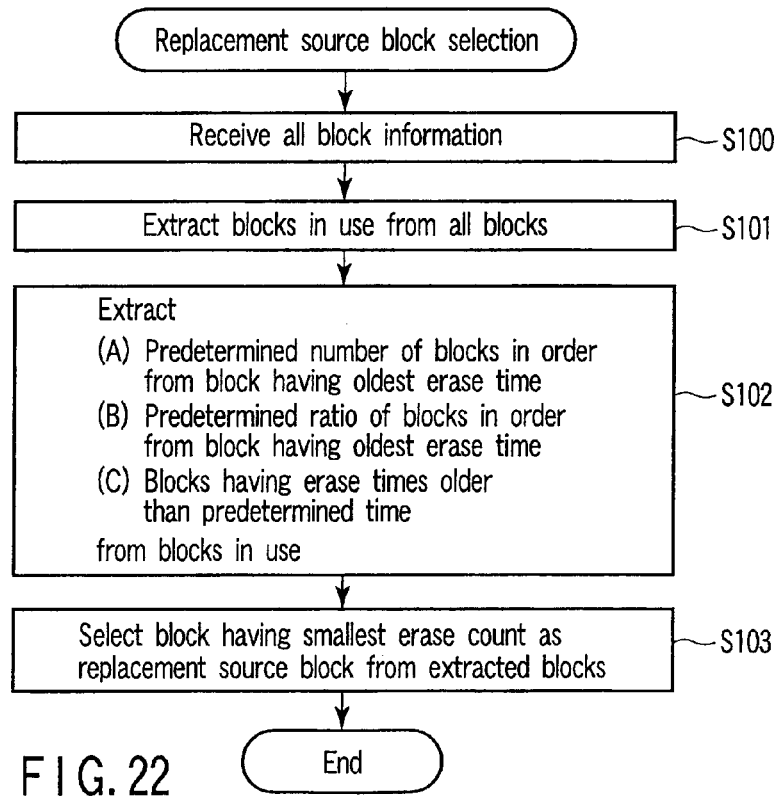
FIG. 22 is a flowchart showing a replacement source block selecting process performed by the replacement-source block selector 33 according to the third embodiment.

FIG. 21 is a block diagram showing the arrangement of a replacement-source block selector 33 according to the third embodiment. FIG. 22 is a flowchart showing a replacement source block selecting process performed by the replacement-source block selector 33.

The replacement-source block selector 33 comprises three selectors 33A to 33C, and a storage unit 33D for storing a replacement source block set value. The replacement-source block selector 33 receives all block information from a block controller 30 (step S100). This all block information is supplied to the selector 33A. The selector 33A checks the states of all blocks, and extracts blocks in use from all the blocks (step S101). The selector 33A then sends block information (block-in-use information) corresponding to the blocks in use to the selector 33B.

The selector 33B extracts, from the block-in-use information, block information meeting a condition set by the replacement source block set value (step S102). The replacement source block set value is one of:
(A) A predetermined number of blocks starting from a block having the oldest erase time
(B) A predetermined ratio of blocks starting from a block having the oldest erase time
(C) Blocks having erase times older than a predetermined time An arbitrary one of conditions (A) to (C) can be selected as the replacement source block set value. For example, when using condition (A) as the replacement source block set value, the selector 33B extracts, from blocks in use, a predetermined number of blocks in order from a block having the oldest erase time. The selector 33B then sends block information corresponding to the extracted blocks to the selector 33C.

Under conditions (A) and (B), blocks in use are sorted in order of erase time, and a predetermined number/ratio of blocks are searched for in order from a block having the oldest erase time. Accordingly, it is possible to increase the number of blocks selected in step S102, and increase the probability that a block having a small erase count is selected in step S103. Under condition (C), only blocks in use whose erase times have exceeded a predetermined time need be sorted, so the processing load is lowest. Also, while a predetermined number/ratio of blocks are always extracted in order from a block having the oldest erase time under conditions (A) and (B), blocks having erase times older than a predetermined time are extracted under condition (C). Under condition (C), therefore, an erase interval can always be a predetermined interval, so the number of candidates for comparison of erase counts can be reduced accordingly.

Subsequently, the selector 33C selects, as a replacement source block, a block having the smallest erase count from the blocks extracted by the selector 33B (step S103). Replacement source block information corresponding to this replacement source block is supplied to a leveling unit 35.

In this embodiment as described in detail above, when selecting a replacement source block to be used in leveling, a block having an old erase time and a small erase count can be selected as the replacement source block from blocks in use. This makes it possible to select, as a replacement source block, a block storing data that is not frequently rewritten, and having a good retention characteristic, and prolong the service life of the NAND flash memory 10.

Fourth Embodiment

The fourth embodiment discloses another example of the short-term rewrite detecting process. In the fourth embodiment, the short-term rewrite detecting process is performed using binary search.

FIG. 23 is a block diagram showing the arrangement of a short-term rewrite detector 34 according to the fourth embodiment. The short-term rewrite detector 34 comprises a selector 34A, an arranging unit 34B, a search list 34C, a determination unit 34D, a storage unit 34E for storing a concentration factor threshold value, and an information output unit 34F.

The determination unit 34D selects a search object block from the search list 34C by using binary search. The determination unit 34D then calculates a concentration factor to be used in short-term rewrite detection for this search object block, and determines whether this concentration factor has exceeded the concentration factor threshold value. On the basis of the determination result, blocks are excluded from the search list 34C and narrowed down to one search object block. By using the last search object block, a boundary where the erase time abruptly changes is searched for.

The concentration factor threshold value stored in the storage unit 34E is used to specify the range of blocks in which data is frequently rewritten, and set on the basis of a criterion indicating a degree to which the service life (or the data retention period) of a NAND flash memory 10 is to be prolonged. The possibility of short-term rewrite detection increases when the concentration factor threshold value is decreased, and decreases when the threshold value is increased.

Figure 24:
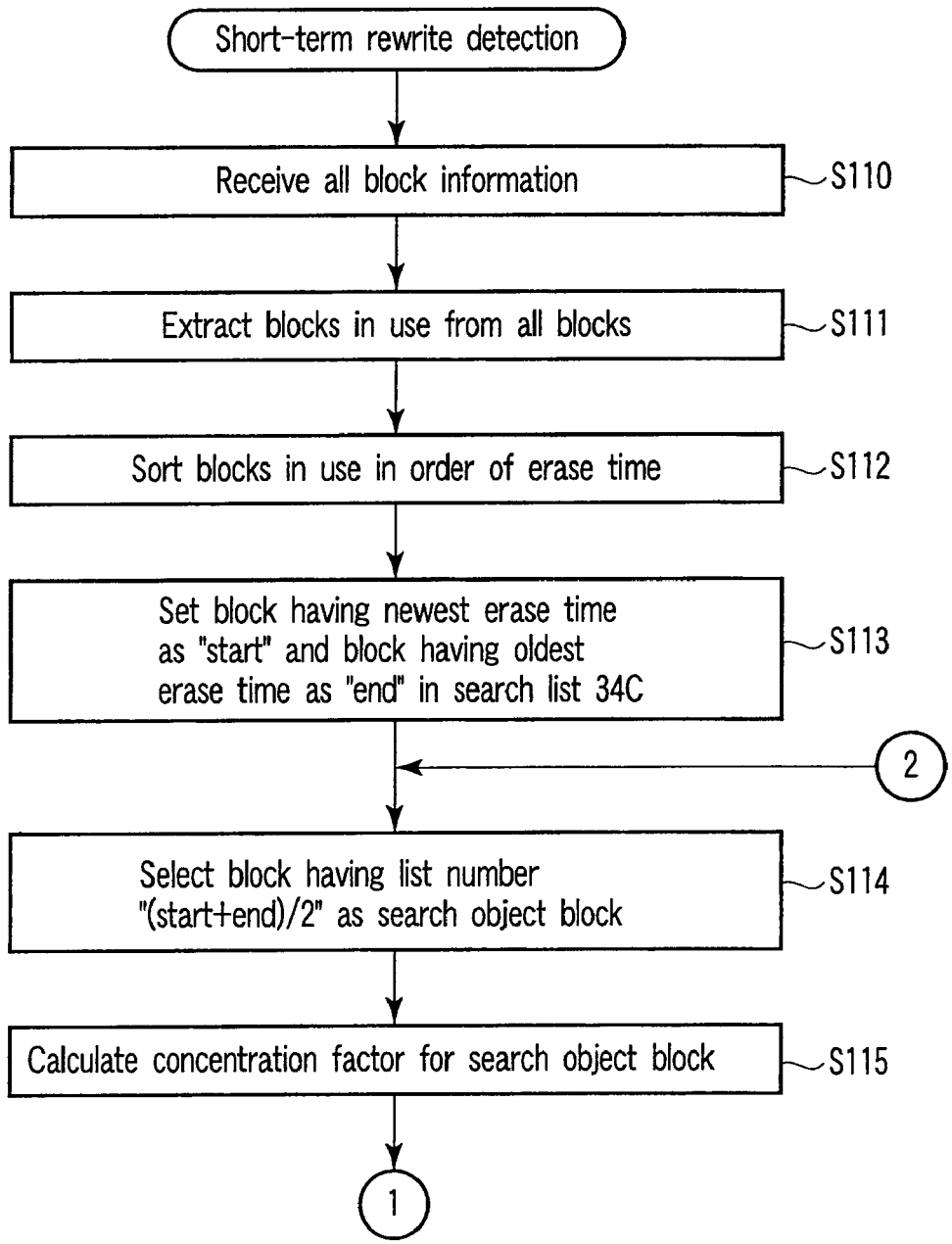
FIG. 24 is a flowchart showing a short-term rewrite detecting process performed by the short-term rewrite detector 34.
Figure 25:
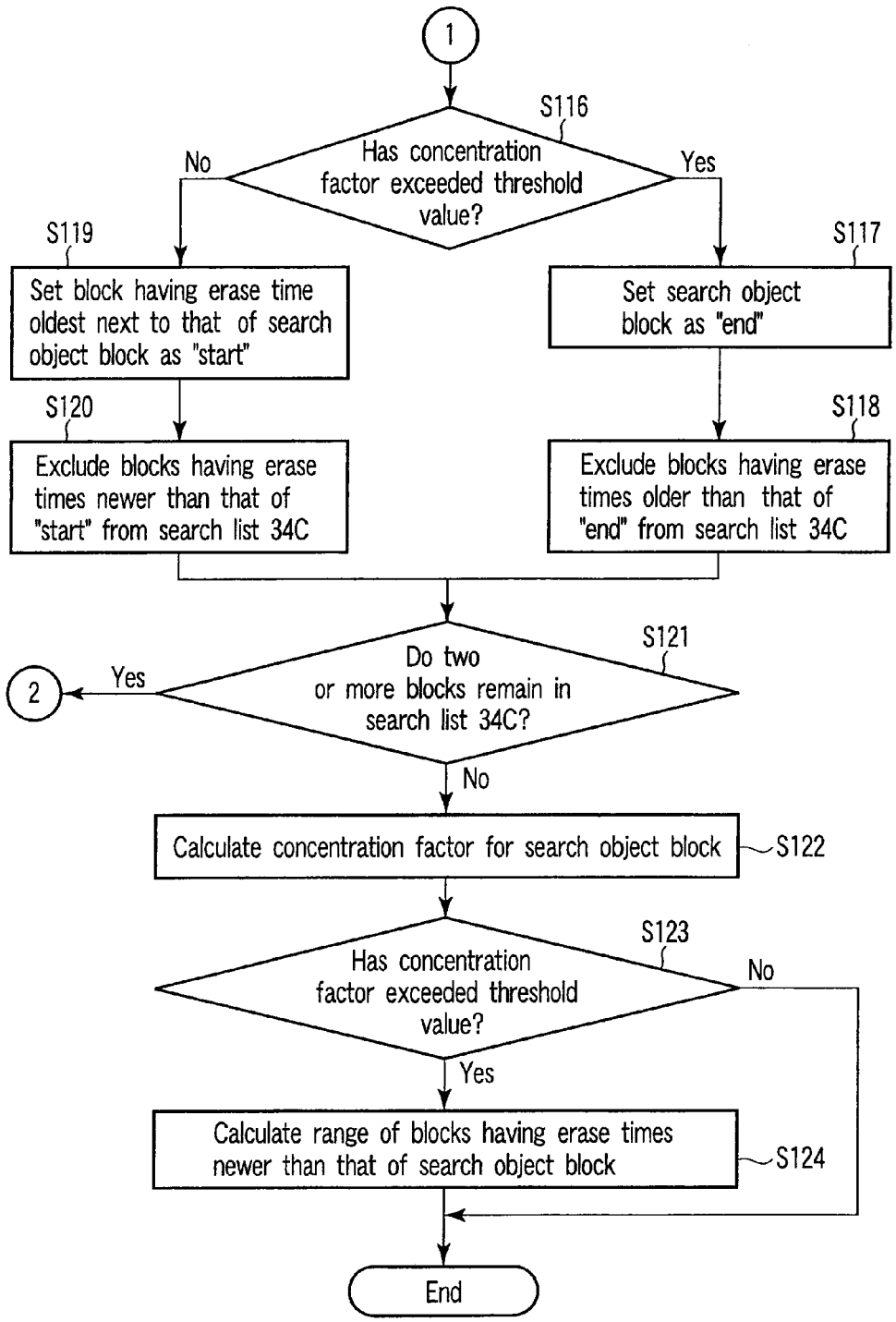
FIG. 25 is a flowchart showing a short-term rewrite detecting process following FIG. 24.

FIGS. 24 and 25 are flowcharts showing a short-term rewrite detecting process performed by the short-term rewrite detector 34.

First, the short-term rewrite detector 34 receives all block information from a block controller 30 (step S110). This all block information is supplied to the selector 34A. The selector 34A checks the states of all blocks, and extracts blocks in use from all the blocks (step S111). The selector 34A then sends block information (block-in-use information) corresponding to the blocks in use to the arranging unit 34B.

The arranging unit 34B checks erase times contained in the block-in-use information, and sorts the blocks in use in order of erase time (step S112). The block information sorted by the arranging unit 34B is placed in the search list 34C, and list numbers are given to the blocks in order from a block having the newest erase time.

Subsequently, the determination unit 34D sets a block having the newest erase time as "start" and a block having the oldest erase time as "end" in the search list 34C (step S113). The determination unit 34D then selects a block having a list number "(start +end)/2" as a search object block (step S114).

After that, the determination unit 34D calculates a concentration factor for the search object block (step S115). This concentration factor is given by Concentration factor=present time−list number−erase time Note that the present time used in the concentration factor is, e.g., supplied from an erase-time measuring unit 31 to the short-term rewrite detector 34. As the present time, it is possible to use, e.g., the count of the erase-count counter 31A.

Then, the determination unit 34D determines whether the calculated concentration factor has exceeded the concentration factor threshold value (step S116). If the concentration factor has exceeded the concentration factor threshold value, the determination unit 34D sets the search object block as "end" (step S117). Subsequently, the determination unit 34D excludes blocks having erase times older than that of "end" from the search list 34C (step S117).

On the other hand, if it is determined in step S116 that the concentration factor has not exceeded the concentration factor threshold value, the determination unit 34D sets, as "start", a block having an erase time oldest next to that of the search object block (step S119). After that, the determination unit 34D excludes blocks having erase times newer than that of "start" from the search list 34C (step S120).

After predetermined blocks are excluded from the search list 34C in step S118 or 5120, the determination unit 34D determines whether two or more blocks remain in the search list 34C (step S121). If two or more blocks remain in the search list 34C, the determination unit 34D returns to step S114 and selects a search object block again.

If it is determined in step S121 that two or more blocks do not remain in the search list 34C, the determination unit 34D selects the last block remaining in the search list 34C as a search object block. Then, the determination unit 34D calculates a concentration factor (=present time−list number−erase time) for this search object block (step S122).

Subsequently, the determination unit 34D determines whether the calculated concentration factor has exceeded the concentration factor threshold value (step S123). If the concentration factor has exceeded the concentration factor threshold value, the determination unit 34D sends a search object block number to the information output unit 34F. By using this search object block number, the information output unit 34F calculates the range of blocks having erase times newer than that of the search object block among all the blocks (step S124). The information output unit 34F sends the above range as short-term rewrite information to the block controller 30. Upon receiving this short-term rewrite information, the block controller 30 sets short-term rewrite flags corresponding to the blocks contained in the short-term rewrite information, and clears short-term rewrite flags for other blocks.

If it is determined in step S123 that the concentration factor has not exceeded the concentration factor threshold value, the determination unit 34D determines that no block having undergone short-term rewrite can be detected, and terminates the short-term rewrite detecting process.

FIG. 26 is a view for explaining a practical example of the short-term rewrite detecting process performed by the short-term rewrite detector 34. Assume that the NAND flash memory 10 includes 12 blocks (blocks #0 to #11), blocks #0 to #7 are blocks in use contained in the search list 34C, and blocks #8 to #11 are free blocks. Blocks #0 to #7 are sorted in order of erase time from a block having the newest erase time. The erase times of these blocks are as shown in FIG. 26. Blocks #0 to #7 contained in the search list 34C are given list numbers in order from the block having the newest erase time.

First, in the search list 34C, block #0 having the newest erase time is set as "start", and block #7 having the oldest erase time is set as "end". Subsequently, block #3 having a list number "(start +end)/2" is selected as a search object block, a concentration factor (=present time−list number−erase time) is calculated for search object block #3, and whether this concentration factor has exceeded the concentration factor threshold value is checked. Assume that the present time is "106" and the concentration factor threshold value is "90". The concentration factor of search object block #3 is "97", and this value has exceeded the threshold value. Accordingly, search object block #3 is set as "end", and blocks #4 to #7 having erase times older than that of block #3 are excluded from the search list 34C.

Then, block #1 having a list number "(start+end)/2" is selected as a search object block, and a concentration factor is calculated for search object block #1. The concentration factor of search object block #1 is "0", and this value has not exceeded the threshold value. Therefore, block #2 having an erase time oldest next to that of search object block #1 is set as "start", and blocks #0 and #1 having erase times newer than that of block #2 are excluded from the search list 34C.

After that, block #2 having a list number "(start +end)/2" is selected as a search object block, and a concentration factor is calculated for search object block #2. The concentration factor of search object block #2 is "97", and this value has exceeded the threshold value. Therefore, search object block #2 is set as "end", and block #3 having an erase time older than that of block #2 is excluded from the search list 34C.

Subsequently, block #2 remaining last in the search list 34C is selected as a search object block, and a concentration factor is calculated for search object block #2. This concentration factor of search object block #2 has exceeded the threshold value. Accordingly, the determination unit 34D sends the number of search object block #2 to the information output unit 34F.

Of all the blocks including free blocks, the information output unit 34F performs calculations on blocks #0, #1, and #8 to #11 having erase times newer than that of search object block #2. The information output unit 34F sends blocks #0, #1, and #8 to #11 as short-term rewrite information to the block controller 30. The block controller 30 sets short-term rewrite flags corresponding to blocks #0, #1, and #8 to #11, and clears short-term rewrite flags corresponding to other blocks. Thus, the information in a block table 30B is updated.

In this embodiment as described in detail above, the short-term rewrite detector 34 can specify a block in which data is frequently rewritten. In addition, search is completed by checking the threshold value "$\log_2 N$" times in the short-term rewrite detecting process. This makes it possible to increase the efficiency of short-term rewrite detection.

Fifth Embodiment

In the fifth embodiment, a NAND controller 11 includes an error check and correction (ECC) circuit, and this ECC circuit detects and corrects an error in data read. Generally, the number of errors increases as the time elapses from data write. Accordingly, a block having many errors is probably a block having an old erase time. In this embodiment, therefore, the number of errors detected by the ECC circuit is used as an index of replacement source block selection.

Figure 27:
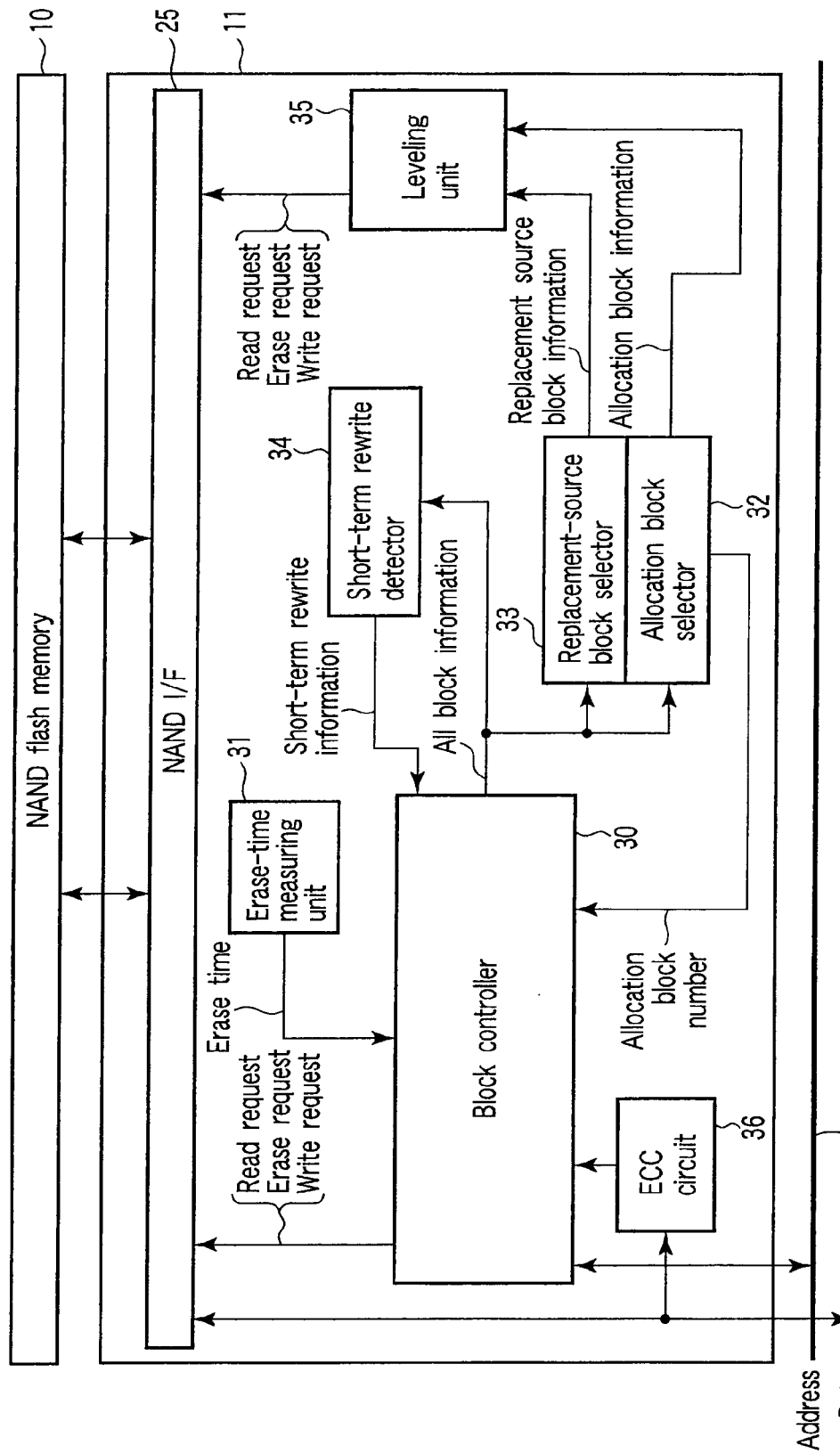
FIG. 27 is a block diagram showing an example of the arrangement of a NAND controller 11 according to the fifth embodiment of the present invention.

FIG. 27 is a block diagram showing an example of the arrangement of the NAND controller 11 according to the fifth embodiment. The NAND controller 11 comprises an ECC circuit 36. When reading data from a NAND flash memory 10, the ECC circuit 36 detects and corrects an error. In addition, the ECC circuit 36 sends the number of detected errors to a block controller 30 for each block.

Figure 28:
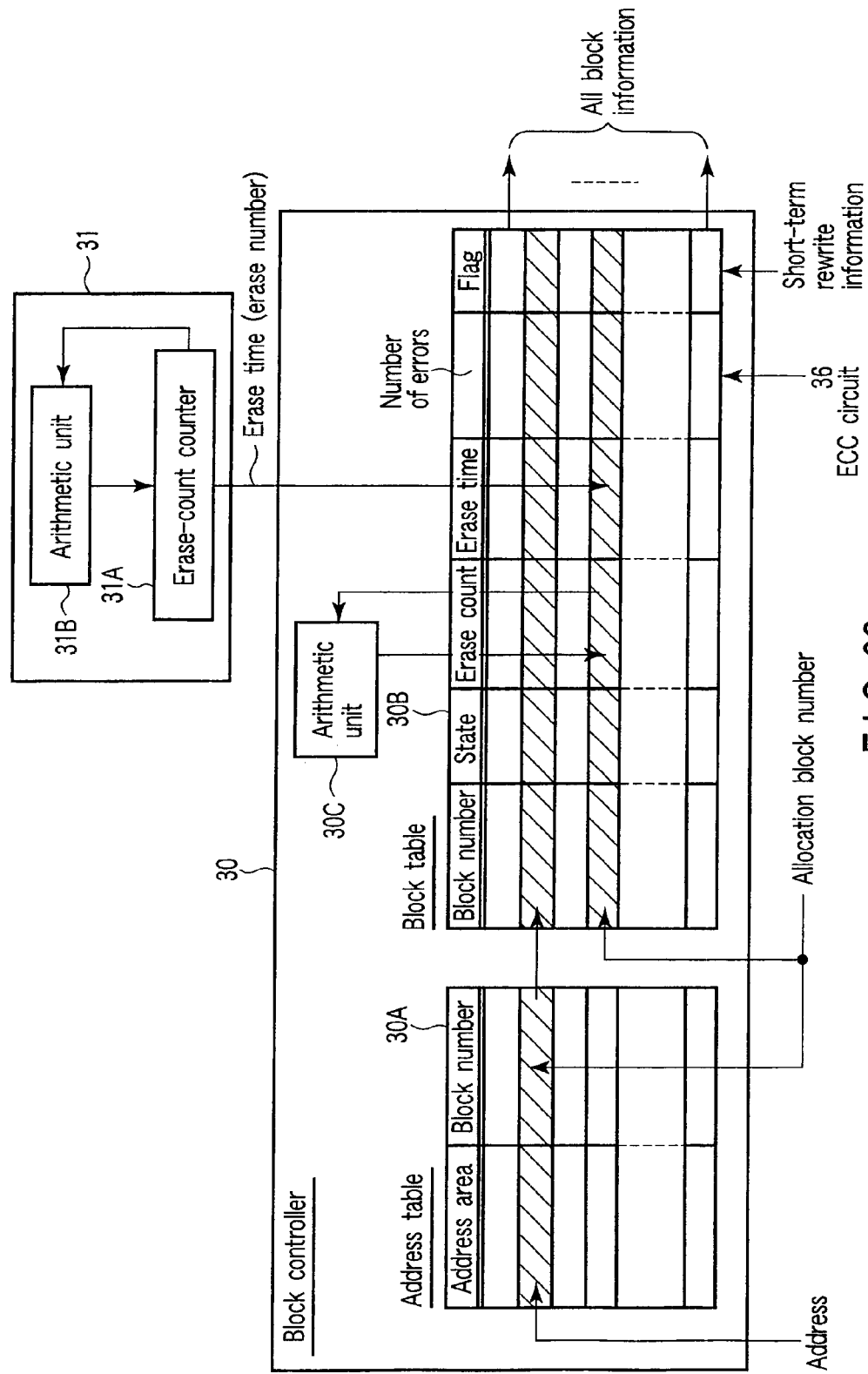
FIG. 28 is a block diagram showing the arrangement of a block controller 30.

FIG. 28 is a block diagram showing the arrangement of the block controller 30. A block table 30B included in the block controller 30 stores the number of errors for each block number. The number of errors included in the block table 30B is updated whenever data is read from the NAND flash memory 10 (whenever the ECC circuit 36 corrects an error).

Figure 29:
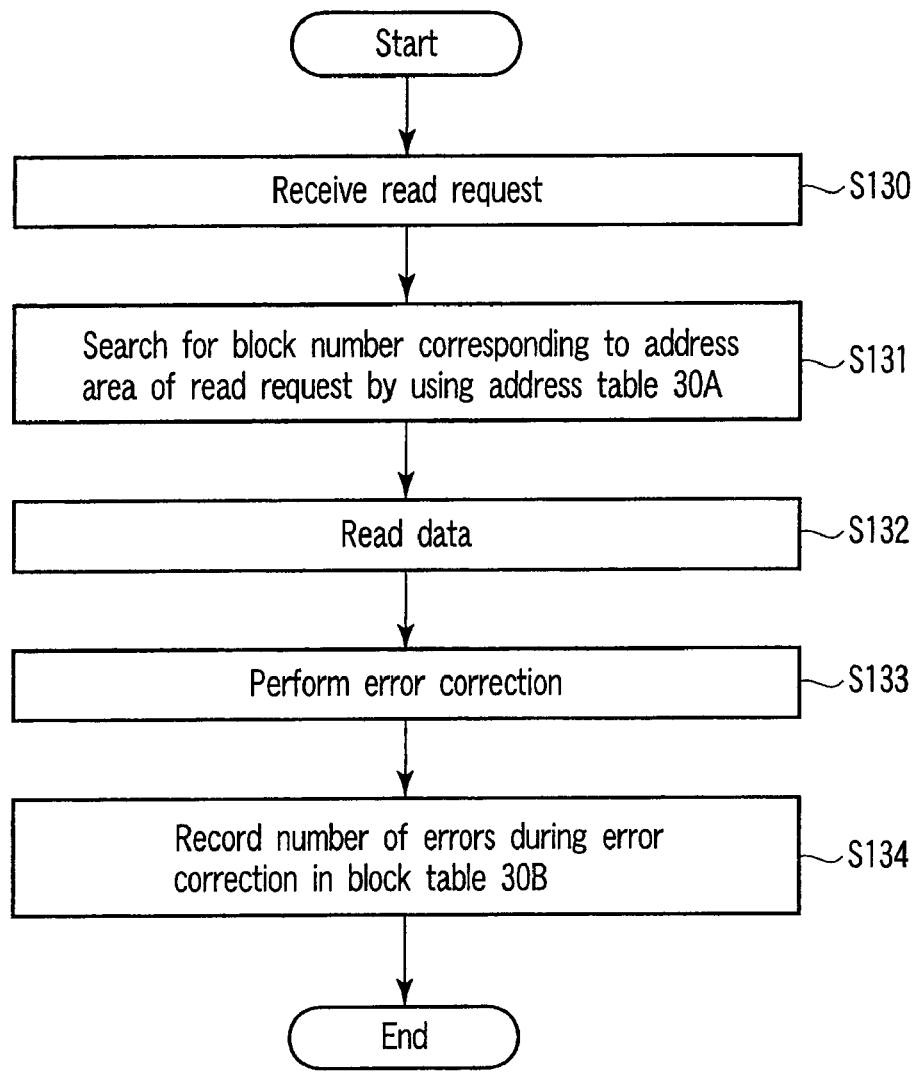
FIG. 29 is a flowchart showing a read operation performed by the NAND controller 11.

Next, the read operation of the NAND controller 11 will be explained. FIG. 29 is a flowchart showing the read operation performed by the NAND controller 11.

First, the NAND controller 11 starts the read operation upon receiving a read request from a CPU 2 (step S130). Then, the block controller 30 searches for a block number corresponding to an address area containing the address of the read request by using an address table 30A (step S131).

Subsequently, the block controller 30 reads data from the block of the read request (step S132). That is, the block controller 30 issues a read request to a NAND interface circuit 25. On the basis of this read request, the NAND interface circuit 25 instructs the NAND flash memory 10 to read data from the block of the read request.

After that, the ECC circuit 36 performs error detection and correction on the data read from the NAND flash memory 10 (step S133). The read data having undergone error correction is supplied to the CPU 2 and the like via a data bus 6. In this error correction, the ECC circuit 36 calculates the number of errors, and sends the number of errors to the block controller 30. The block controller 30 receives the number of errors from the ECC circuit 36, and records the number of errors in the block table 30B. In this manner, the number of errors contained in the block table 30B is updated.

Figure 30:
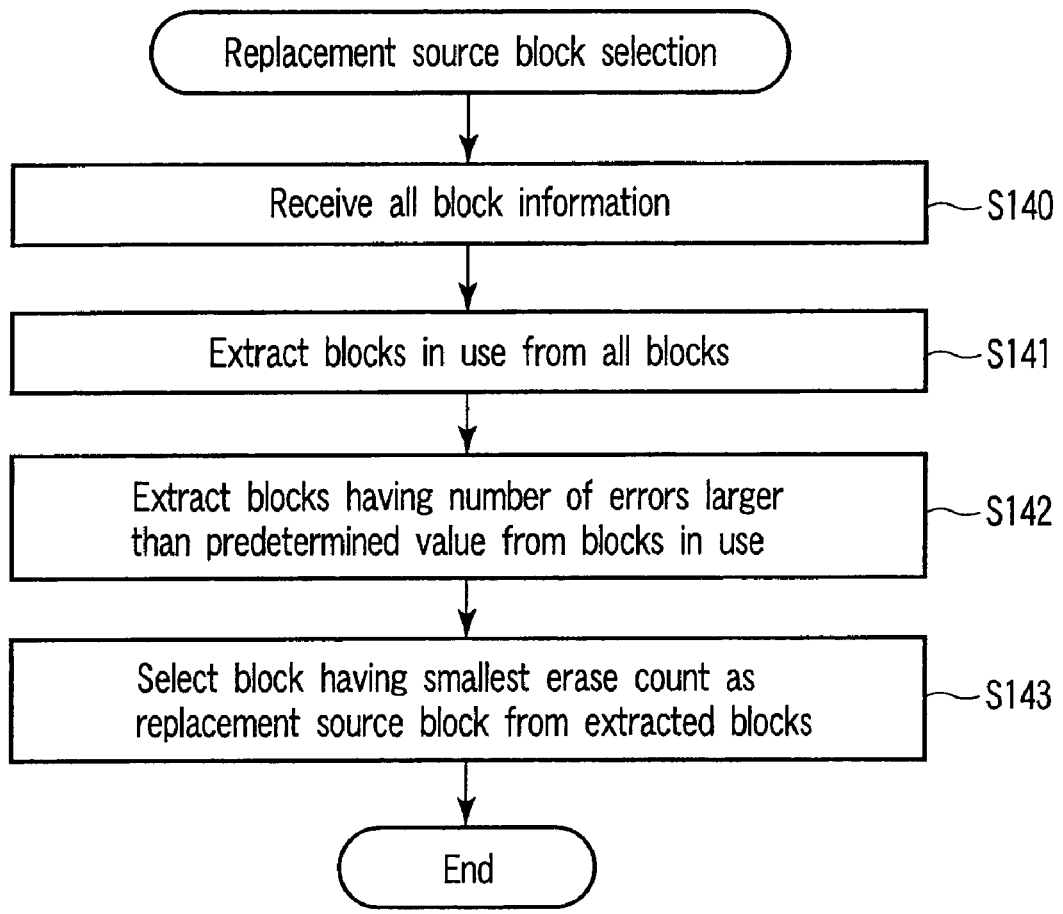
FIG. 30 is a flowchart showing a replacement source block selecting process performed by a replacement-source block selector 33.

A replacement source block selecting process performed by a replacement-source block selector 33 will be explained below. FIG. 30 is a flowchart showing the replacement source block selecting process performed by the replacement-source block selector 33. Note that the arrangement of the replacement-source block selector 33 is the same as that shown in FIG. 21.

The replacement source block selector 33 receives all block information from the block controller 30 (step S140). This all block information is supplied to a selector 33A. The selector 33A checks the states of all blocks, and extracts blocks in use from all the blocks (step S141). The selector 33A then sends block information (block-in-use information) corresponding to the blocks in use to a selector 33B.

The selector 33B extracts, from the block-in-use information, block information meeting a condition set by a replacement source block set value (step S142). In this step, "a block having the number of errors larger than a predetermined value" is set as the replacement source block set value.

Subsequently, a selector 33C selects, from the blocks extracted by the selector 33B, a block having the smallest erase count as a replacement source block (step S143). Replacement source block information corresponding to this replacement source block is supplied to a leveling unit 35.

In this embodiment as described in detail above, a block in which rewrite has collectively occurred within a short period during the write process of a memory system 1 can be replaced with a block that has not been released for a long time after being allocated once by data write. This makes it possible to suppress the exhaustion of a block caused by a short erase time interval, and average the exhaustion of blocks in the whole NAND flash memory 10.

In addition, a block having a large number of errors calculated by ECC circuit is selected as a replacement source block. Since, therefore, data of a block having a large number of errors is rewritten, a refreshing process (in which data stored in the NAND flash memory 10 is read, undergoes error correction, and is written back in the NAND flash memory 10) is performed simultaneously with the leveling process. As a consequence, the number of times of the refreshing process can be reduced. This makes it possible to obtain the effect of reducing the amount of data write resulting from refresh.

Embodiment

Figure 31:
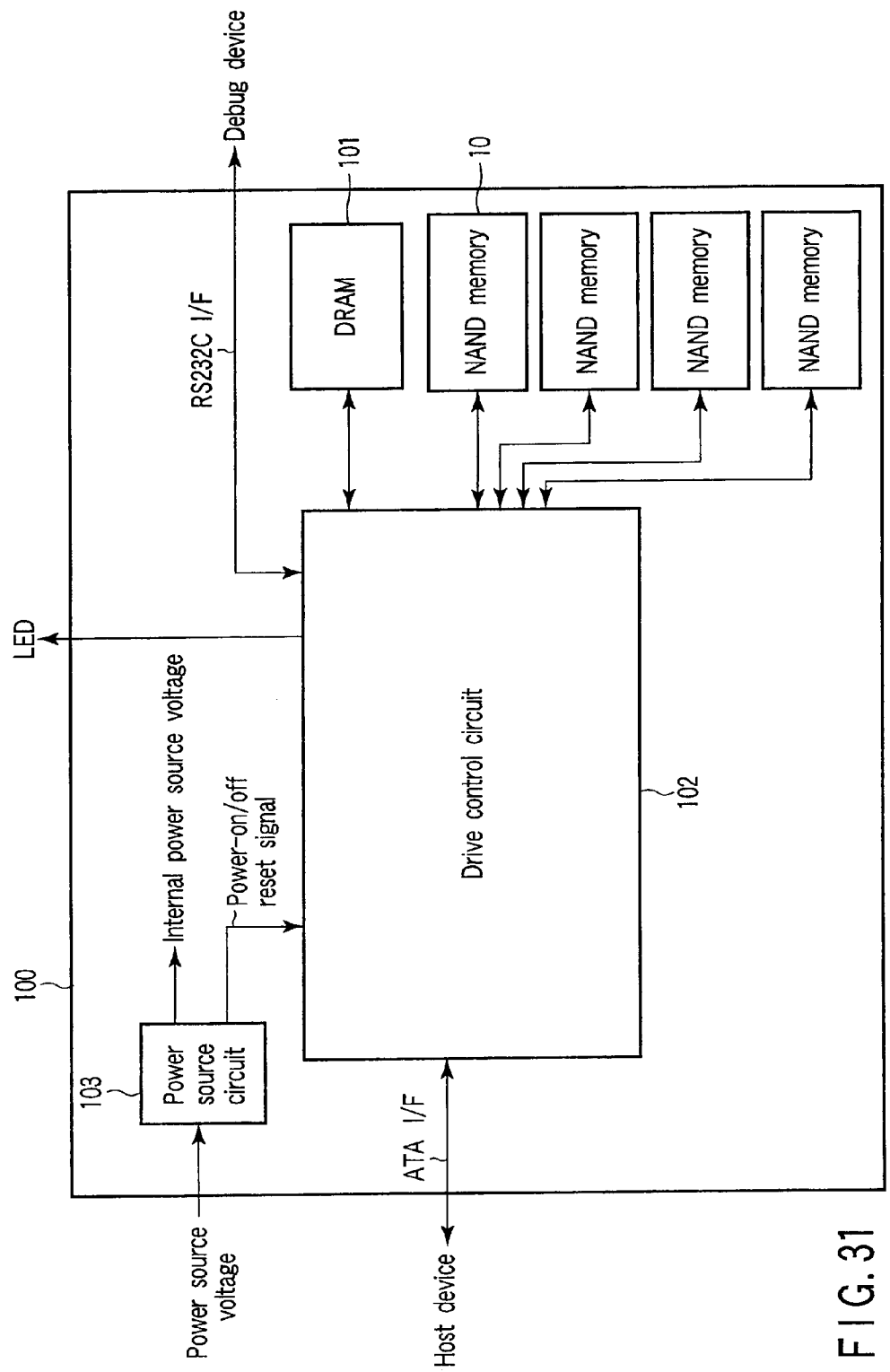
FIG. 31 is a block diagram showing the configuration of an SSD 100 according to an embodiment.

An embodiment obtained by configuring the memory system 1 of each of the above embodiments as a solid-state drive (SSD) is explained. FIG. 31 is a block diagram showing the configuration of an SSD 100.

The SSD 100 includes a plurality of NAND flash memories (NAND memories) 10 for data storage, a DRAM 101 for data transfer or for a working area, a drive control circuit 102 that controls the above units and a power source circuit 103. The drive control circuit 102 outputs a control signal to control a status display LED provided outside the SSD 100.

The SSD 100 transfers data with respect to a host device such as a personal computer via an ATA interface (ATA I/F). Further, the SSD 100 transfers data with respect to a debug device via an RS232C interface (RS232C I/F).

The power source circuit 103 is supplied with external power source voltage and generates a plurality of internal power source voltages by use of the external power source voltage. The internal power source voltages are supplied to the respective units of the SSD 100. Further, the power source circuit 103 detects a rise or fall of the external power source voltage and generates a power-on reset signal or power-off reset signal. The power-on reset signal and power-off reset signal are supplied to the drive control circuit 102.

Figure 32:
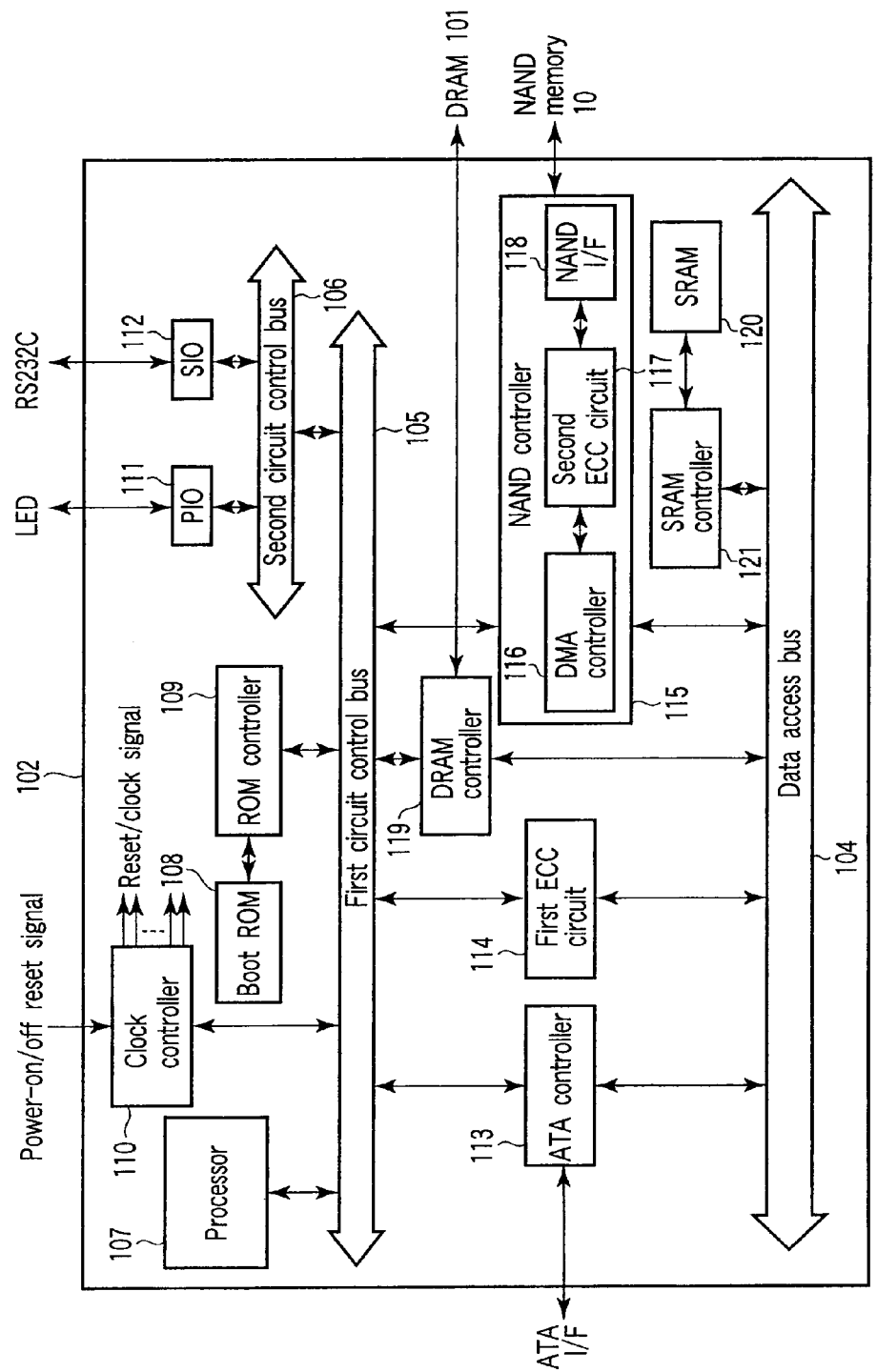
FIG. 32 is a block diagram showing the configuration of a drive control circuit 102.

FIG. 32 is a block diagram showing the configuration of the drive control circuit 102. The drive control circuit 102 includes a data access bus 104, first circuit control bus 105 and second circuit control bus 106.

A processor 107 that controls the whole portion of the drive control circuit 102 is connected to the first circuit control bus 105. Further, a boot ROM 108 in which boot programs of management programs (FW: firmwares) are stored is connected to the first circuit control bus 105 via a ROM controller 109. Also, a clock controller 110 that receives a power-on/off reset signal from the power source circuit 103 and supplies a reset signal and clock signal to the respective units is connected to the first circuit control bus 105.

The second circuit control bus 106 is connected to the first circuit control bus 105. A parallel IO (PIO) circuit 111 that supplies a status display signal to the status display LED and a serial IO (SIO) circuit 112 that controls the RS232C interface are connected to the second circuit control bus 106.

An ATA interface controller (ATA controller) 113, first error check and correction (ECC) circuit 114, NAND controller 115 and DRAM controller 119 are connected to both of the data access bus 104 and first circuit control bus 105. The ATA controller 113 transfers data with respect to the host device via the ATA interface. An SRAM 120 used as a data work area is connected to the data access bus 104 via an SRAM controller 121.

The NAND controller 115 includes a NAND I/F 118 that performs an interface process with respect to the four NAND memories 10, a second ECC circuit 117 and a DMA transfer controlling DMA controller 116 that performs access control between the NAND memory and DRAM.

Figure 33:
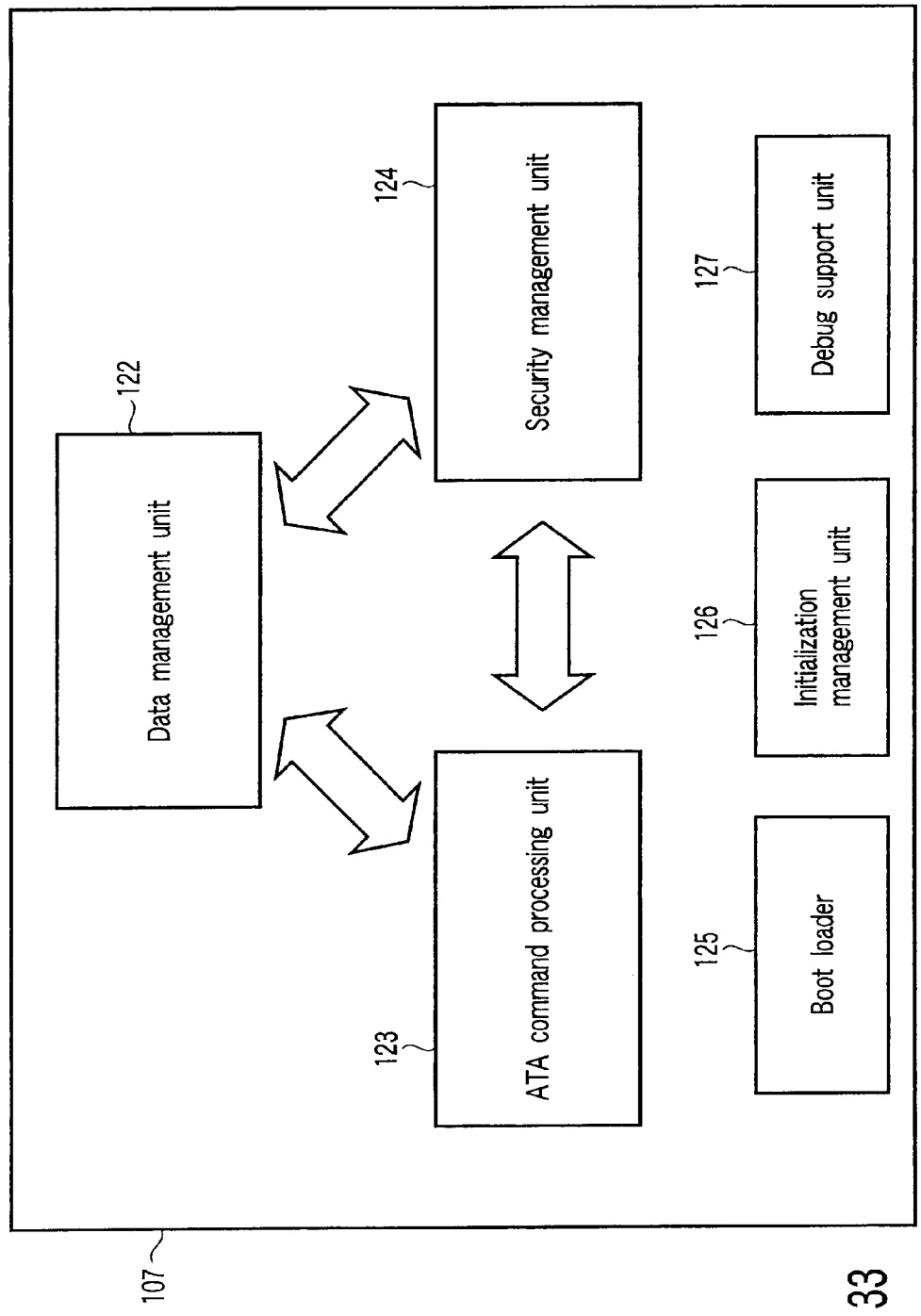
FIG. 33 is a block diagram showing the configuration of a processor 107.

FIG. 33 is a block diagram showing the configuration of the processor 107. The processor 107 includes a data management unit 122, ATA command processing unit 123, security management unit 124, boot loader 125, initialization management unit 126 and debug support unit 127.

The data management unit 122 controls various functions associated with a NAND chip and data transfer between the NAND memory and DRAM via the NAND controller 115 and first ECC circuit 114.

The ATA command processing unit 123 performs a data transfer process in cooperation with the data management unit 122 via the ATA controller 113 and DRAM controller 119. The security management unit 124 manages various security information items in cooperation with the data management unit 122 and ATA command processing unit 123. The boot loader 125 loads various management programs (FW) from the NAND memory 10 into the SRAM 120 at the power-on time.

The initialization management unit 126 initializes the various controllers/circuits in the drive control circuit 102. The debug support unit 127 processes debug data supplied from the exterior via the RS232C interface.

FIG. 34 is a perspective view showing one example of a portable computer 200 having the SSD 100 mounted thereon. The portable computer 200 has a main body 201 and display unit 202. The display unit 202 includes a display housing 203 and a display device 204 accommodated in the display housing 203.

The main body 201 includes a casing 205, a keyboard 206 and a touch pad 207 used as a pointing device. In the casing 205, a main circuit board, optical disk device (ODD) unit, card slot, SSD 100 and the like are accommodated.

The card slot is provided adjacent to the peripheral wall of the casing 205. In the peripheral wall, an opening 208 facing the card slot is formed. The user can removably insert an additional device into the card slot from the exterior of the casing 205 via the opening 208.

The SSD 100 can be mounted on the internal portion of the portable computer 200 and used instead of the conventional HDD or inserted into the card slot of the portable computer 200 and used as an additional device.

Figure 35:
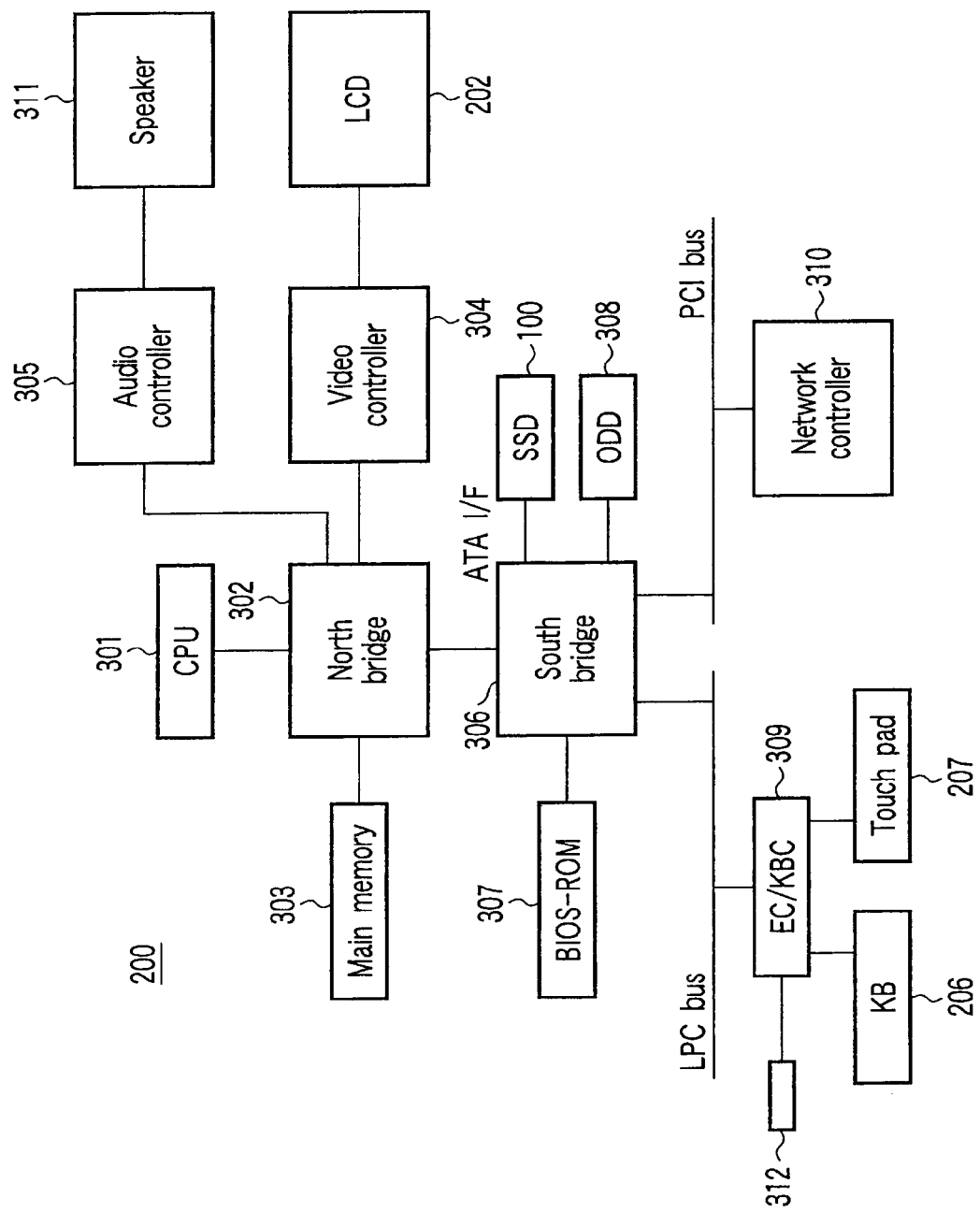
FIG. 35 is a block diagram showing an example of a system configuration of a portable computer 200 using an SSD 100.

FIG. 35 shows an example of a system configuration of a portable computer 200 using an SSD 100. The portable computer 200 comprises a CPU 301, a north bridge 302, a main memory 303, a video controller 304, an audio controller 305, a south bridge 306, a BIOS-ROM 307, an SSD 100, an ODD unit 308, an embedded controller/keyboard controller IC (EC/KBC) 309, a network controller 310, etc.

The CPU 301 is a processor used for controlling the operation of the portable computer 200, and executes the operating system (OS) loaded in the main memory 303 from the SSD 100. When the ODD unit 308 enables at least one of read processing and write processing to be executed for the loaded optical disk, CPU 301 executes the processing.

The CPU 301 also executes the system BIOS (Basic Input Output System) stored in the BIOS-ROM 307. The system BIOS is a program used for controlling the hardware components of the portable computer 200.

The north bridge 302 is a bridge device for connecting the local bus of CPU 301 and the south bridge 306. The north bridge 302 incorporates a memory controller used for controlling the access to the main memory 303.

The north bridge 302 has a function of executing communications with the video controller 304 and the audio controller 305 by way of an AGP bus (Accelerated Graphics Port Bus).

The main memory 303 temporarily stores programs and data and functions as a work area of CPU 301. The main memory 303 is made of a DRAM, for example.

The video controller 304 is a video reproduction controller used for controlling a display unit (LCD) 202. The display unit 202 is used as a display monitor of the portable computer 200.

The audio controller 305 is an audio reproduction controller used for controlling the speaker 311 of the portable computer 200.

The south bridge 306 controls the devices on an LPC (Low Pin Count) bus and the devices on a PCI (Peripheral Component Interconnect) bus. The south bridge 306 also controls the SSD 100 through an ATA interface. The SSD 100 is a storage unit used for storing various kinds of software and data.

The portable computer 200 accesses the SSD 100 in units of sectors. A write command, a read command, a flash command, etc. are supplied to the SSD 100 through the ATA interface.

The south bridge 306 has a function of controlling the access to the BIOS-ROM 307 and the ODD unit 308. The EC/KBC 309 is a 1-chip microcomputer in which an embedded controller for performing power management and a keyboard controller for controlling a keyboard (KB) 206 and a touch pad 207 are embedded.

The EC/KBC 309 has a function of turning on or off the portable computer 200 in accordance with the user's operation of a power button 312. The network controller 310 is a communication unit that performs communications with an external network, such as the Internet.

The memory system 1 of the above embodiments is not limited to the SSD and can be configured as a memory card that is represented by an SD (trademark) card. When the memory system 1 is configured as a memory card, it can be applied to not only the portable computer but also other various electronic devices such as a portable telephone, PDS, digital still camera and digital video camera.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A control method of a memory system including a non-volatile memory having a plurality of blocks as data erase units, the method comprising:
   measuring an erase time at which data in each block is erased;
   generating a block table which associates a state value indicating one of a free state and a used state with the erase time for each block;
   detecting blocks in each of which rewrite has frequently occurred within a short period;
   selecting a free block having an old erase time as a first block, on the basis of an information in the block table;
   selecting a block in use having an old erase time as a second block, on the basis of the information in the block table; and
   moving data in the second block to the first block if the first block is included in the detected blocks.

2. The method according to claim 1, wherein the first block is reselected if the data in the second block is moved to the first block.

3. The method according to claim 1, further comprising:
   counting the number of times of erase of each block,
   wherein the block table stores the erase count.

4. The method according to claim 3, wherein the moving includes moving the data in the second block to the first block if the first block is included in the detected blocks, or if a difference between erase counts of the first block and the second block has exceeded a threshold value.

5. The method according to claim 1, wherein the detecting includes:
   detecting a boundary where a difference between erase times of blocks is large; and
   detecting a block having an erase time newer than the boundary as the blocks in which rewrite has collectively occurred within a short period.

6. The method according to claim 1, wherein the block table stores a flag indicating whether rewrite has collectively occurred in a block within a short period.

7. The method according to claim 1, wherein the detecting includes:
   calculating, among blocks in use, a difference between an erase time of a third block and an erase time of a fourth block whose erase time is newest next to that of the third block; and
   if the difference is larger than a predetermined interval, detecting blocks having an erase time newer than that of the fourth block among all blocks.

8. The method according to claim 7, wherein the detecting includes:
   arranging information of blocks in use in order of erase time; and
   calculating the difference between the erase times of the third block and the fourth block on the basis of the arranged information.

9. The method according to 1, wherein the detecting includes:
   calculating a difference between a present time and an erase time for blocks in use;
   determining a fifth block whose erase time is newest among blocks in which the difference has exceeded a threshold value; and
   detecting blocks having an erase time newer than that of the fifth block among all blocks.

10. The method according to claim 9, wherein the detecting includes:

arranging information of blocks in use in order of erase time; and determining whether the difference has exceed the threshold value on the basis of the arranged information.

11. The method according to claim 1, wherein the first block is a free block having an oldest erase time.

12. The method according to claim 1, wherein the first block is a block having a smallest erase count from a predetermined number of free blocks starting from a block having an oldest erase time.

13. The method according to claim 1, wherein the first block is a block having a smallest erase count from a predetermined ratio of free blocks starting from a block having an oldest erase time.

14. The method according to claim 1, wherein the first block is a block having a smallest erase count from free blocks having erase times older than a predetermined time.

15. The method according to claim 1, wherein the second block is a block in use having an oldest erase time.

16. The method according to claim 1, wherein the second block is a block having a smallest erase count from a predetermined number of blocks in use starting from a block having an oldest erase time.

17. The method according to claim 1, wherein the second block is a block having a smallest erase count from a predetermined ratio of blocks in use starting from a block having an oldest erase time.

18. The method according to claim 1, wherein the second block is a block having a smallest erase count from blocks in use having erase times older than a predetermined time.

19. The method according to claim 1, further comprising calculating the number of errors of data read from the nonvolatile memory, wherein the block table stores the number of errors of each block, and the second block is a block having a smallest erase count from blocks in use having the number of errors larger than a predetermined value.

20. The method according to claim 1, wherein the measuring includes counting the number of times of erase executed in all blocks, and the erase time corresponds to the number of times of erase.

21. The method according to claim 1, wherein, the measuring includes measuring a time at which data in each block is erased, and the erase time corresponds to the time.

22. The method according to claim 1, wherein, the measuring includes measuring a power supply time of the memory system when data in each block is erased, and the erase time corresponds to the power supply time.

* * * * *